United States Patent
Wadland et al.

(10) Patent No.: US 7,793,249 B1
(45) Date of Patent: Sep. 7, 2010

(54) METHOD AND SYSTEM FOR ADAPTIVE BUNDLING OF CONNECTIONS IN USER-GUIDED AUTOROUTING

(75) Inventors: Ken Wadland, Grafton, MA (US); Greg Horlick, Madison, AL (US); Randall Lawson, Westford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/564,083

(22) Filed: Nov. 28, 2006

Related U.S. Application Data

(63) Continuation-in-part of application No. 11/492,021, filed on Jul. 25, 2006, now Pat. No. 7,536,665.

(51) Int. Cl.
*G06F 17/50* (2006.01)

(52) U.S. Cl. .............. 716/12; 716/11; 716/13; 716/14; 716/15

(58) Field of Classification Search .............. 716/12–16
See application file for complete search history.

(56) References Cited

U.S. PATENT DOCUMENTS

| | | | |
|---|---|---|---|
| 6,385,758 B1 * | 5/2002 | Kikuchi et al. ............. 716/2 |
| 6,516,456 B1 * | 2/2003 | Garnett et al. ............. 716/8 |
| 6,560,763 B1 * | 5/2003 | Sugiyama et al. ............. 716/13 |
| 6,892,371 B1 * | 5/2005 | Teig et al. ............. 716/13 |
| 6,915,499 B1 | 7/2005 | Teig et al. |
| 7,065,729 B1 | 6/2006 | Chapman |
| 7,237,214 B1 * | 6/2007 | Pandey et al. ............. 716/7 |
| 7,360,177 B1 * | 4/2008 | Kong et al. ............. 716/1 |
| 7,389,485 B1 | 6/2008 | Rahut et al. |
| 2002/0144227 A1 * | 10/2002 | Das et al. ............. 716/12 |
| 2003/0135829 A1 | 7/2003 | Garrepally et al. |
| 2004/0123262 A1 | 6/2004 | Shirota et al. |
| 2004/0199884 A1 * | 10/2004 | Brittain et al. ............. 716/4 |
| 2004/0250230 A1 * | 12/2004 | Itou et al. ............. 716/15 |
| 2005/0125759 A1 | 6/2005 | Ali et al. |
| 2006/0031792 A1 | 2/2006 | Zavadsky et al. |

OTHER PUBLICATIONS

"Microsoft Excel 2003", by classes4computers.com, http://www.classes4computers.com/members/Excel2003/Lesson20/Lesson20.pdf , pp. 334-341 @2003 Global Knowlege Network, Inc.*

* cited by examiner

*Primary Examiner*—Thuan Do
*Assistant Examiner*—Nha T Nguyen
(74) *Attorney, Agent, or Firm*—Rosenberg, Klein & Lee

(57) ABSTRACT

Automatic bundle filtering is provided to selectively configure a circuit design having a plurality of component terminals for physical implementation. A placement of components is established for a layout of the circuit design, and a plurality of connections to be routed between predetermined terminals of the components are defined for the layout, with a certain plurality of them selectively grouped into at least one candidate bundle. At least one filter is applied to the connections of each candidate bundle for responsive segregation according to a preselected connection discriminant into one or more updated bundle candidates. Each updated bundle candidate is preferably evaluated in accordance with at least one preselected bundling criteria to identify acceptable bundle candidates therefrom. Bundles corresponding to the acceptable bundle candidates are then generated.

23 Claims, 20 Drawing Sheets

| TABLE ID | RAT ID | COMPONENT 1 | COMPONENT 2 |
|---|---|---|---|
| 1 | U1.1:U2.1 | U1 | U2 |
| 2 | U3.4:U5.2 | U3 | U5 |
| 3 | U2.5:U1.6 | U2 | U1 |
| 4 | U5.4:U3.2 | U5 | U3 |
| 5 | U1.6:U2.6 | U1 | U2 |
FIG. 12A
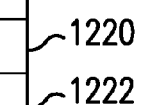
FIG. 12B
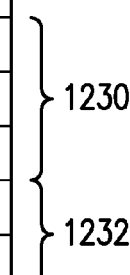
FIG. 12C

| TABLE ID | RAT ID | COMPONENT 1 | SIDE 1 | COMPONENT 2 | SIDE 2 |
|---|---|---|---|---|---|
| 1 | U1.1:U2.1 | U1 | E | U2 | S |
| 2 | U3.4:U5.2 | U3 | N | U5 | S |
| 3 | U2.5:U1.6 | U1 | W | U2 | E |
| 4 | U5.4:U3.2 | U3 | E | U5 | S |
| 5 | U1.6:U2.6 | U1 | N | U2 | W |

FIG.14

METHOD AND SYSTEM FOR ADAPTIVE BUNDLING OF CONNECTIONS IN USER-GUIDED AUTOROUTING

RELATED U.S. APPLICATION DATA

Continuation in part of U.S. application Ser. No. 11/492,021, filed 25 Jul. 2006.

BACKGROUND OF THE INVENTION

1. Field of the Invention

The invention disclosed herein is related to automatically routing paths for interconnections between terminals of interoperable components. More specifically, the invention is related to providing to an automatic circuit router, or "autorouter", guidance to route associated interconnections along a user-specified common path.

2. Description of the Prior Art

In the early days of Printed Circuit Board (PCB)/Package design, manual layout tools and terminal interconnection methods were adequate to fully provide the geometrically defined interconnection paths between terminals of a circuit. These simple solutions to the "interconnect problem" were achievable due to the small number of interconnections in the circuits, simple circuit layouts and that registration of artwork required only moderate precision. As component feature sizes became smaller, the scope of the interconnect problem in terms of connection count and layout complexity grew to a point where manual methods no longer suffice. Computer-aided Design (CAD) tools were introduced at that time to assist designers in realizing more complicated designs, albeit still manually. In the CAD systems, each interconnect pattern was interactively created with a toolset provided by a user interface.

Routing engines were then introduced to at least partially automate the creation of the interconnect pattern, thereby relieving the designer of some of the tedious interconnection tasks. However, circuit design and manufacturing technologies continued to outpace advances in routing engine technology. Technological advances leading to higher operating frequencies, faster logic architectures, and longer and wider data paths necessitated stricter design constraints that were beyond the capabilities of the available routing engines. Thus, the most difficult and most challenging designs continued to be routed manually, with a designer interactively selecting the exact path vertex-by-vertex for each connection. Then, when an Engineering Change Order (ECO) was issued, extensive manual editing would often be required, particularly when many connections had to be retuned to meet established delay constraints. In such cases, the long period of time devoted to the design phase severely delayed the introduction of new products to the marketplace.

Recent years have seen unprecedented expansion of functional requirements for PCB designs. PCB designers must now cope with a myriad of interconnect topologies and logic signal levels, and must be constantly keen to tolerance stack-up and to implications to signal integrity of an evolving placement/interconnect solution. Designers must balance dozens of variables that may resolve into hundreds of valid and invalid solutions without any real guidance from the available tools toward selecting the best solution. Electronic Design Automation (EDA) customers have responded to these shortcomings by demanding more route engine power, interactive functionality and diverse capabilities from their CAD tools.

Currently, users solve difficult routing problems interactively through a manual CAD editing environment according to a tedious manual process. Certain connections are selected, some portion of the path for these connections is routed, problems are located and resolved, and the process is iterated until done. This is an extremely slow and arduous process and, because the PCB design is typically the last stage in the production of a new product, time-to-market for the entire product is adversely affected.

Traditionally, PCB autorouters have allowed the user only limited control over the routing process and limited ability to influence autorouting decisions. There have been some mechanisms by which users may force certain paths to be preserved or to restrict routing to certain regions. It is quite apparent, though, that as PCB complexity continues to soar, more and more designs will be beyond the limit of the current generation of autorouting tools.

Before routing a PCB in detail, designers first develop a mental model of how the interconnect problem should ultimately be solved. This process can take weeks or months, as experiments with different topologies are conducted and signal integrity engineers are consulted, adjusting accordingly the set of electrical design constraints. Their mental concept or vision is considered their routing strategy or plan and, although sometimes sketched out on paper, must remain in focus by the designer throughout the routing process. But, because this mental planning information cannot be conveyed to the autorouter, it is extremely unlikely that the autorouter would produce the solution that follows the design team's plan. An effective approach to capture the planning data electronically to incorporate it into the design database is heretofore unknown. Having no alternative, PCB designers are then forced to manually route the entire design. This additional work can add several weeks or months to the product development process.

Modern autorouters are not without some limited mechanisms for displaying dedicated connections and controlling certain interconnection routes. Schematics tools, for example, have long implemented a "bus", i.e., a set of related conductors that are graphically treated as one. For example, one line on the user interface labeled "addr[63:0]" could graphically represent an entire 64-bit bus. This allows the electrical designer to focus on the schematic interconnect at a higher level of abstraction without being overwhelmed by details. While this has worked well in schematics, the concept has not been extended to control an autorouter. Moreover, because the locations on a schematic typically have no relationship to locations on a PCB, the bus concept does not translate well into the layout regime.

Some PCB layout tools have included certain graphical features, such as a "fat rat", where two or more related connections between the same two components are displayed as one line. However, such tools have merely been used for the graphical display of unrouted connections and have not been provided to an autorouter to control routing.

Other EDA toolsets of the prior art have included "multi-plow" functionality that allows several interconnections to be routed together. The user interactively selects several interconnections and manually routes them as a group. Traditionally, this is achieved by pointing to a location in the layout with an indicating device and the autorouter then attempts to route all selected wires to that location. However, these systems have failed to provide planning features or data retention. That is to say, once the plow action is completed, no information about the selected interconnections or about the guided location is stored. Thus, any modification to the design, even if the routes need only to be "tweaked", requires that the process has to begin all over again.

Several prior art PCB layout tools have implemented a "hug" feature, where the user manually routes one interconnection and other interconnections are automatically routed to follow the original interconnection's path. However, nothing is retained by the autorouter for future use. For example, there is no association maintained between the guiding path and the follower paths. If the autorouter is started after this process is completed, the user-created pattern is destroyed.

The present technology continues to fall short of meeting the needs of the designer. Without a means of conveying to the route engine what is in the mind of the designer, the designer must ultimately perform the routing tasks manually. The designer is left in the position of "hoping" that their best guess is the correct one. Current tools do not provide a way to conceptualize the problem, let alone resolve it, visualize it or quickly assess whether a potential solution is good or bad. Moreover, in that a design plan cannot be realized without consideration of all constraints, the designer is left to interpret and reconcile problems as they manually route.

The need is apparent for a toolset that allows the router to automatically perform the tedious routing tasks, while at the same time allowing the designer to influence the solution interactively by inputting their design intent into the design. Data abstraction should be implemented to allow data manipulation and storage of the designer's plan. Such tools should also make possible recognition of patterns in the data within the design and to bundle the data together. It should allow the designer to visualize these patterns so as to develop a high level view or a flow plan, while verifying the integrity of this solution as it develops. It should also, of course, convert the data abstraction into a real interconnect pattern through a routing engine that operates on the abstraction to verify the routing solution and instantiate it correctly.

SUMMARY OF THE INVENTION

It is a primary object of the present invention to provide a method and system which automatically bundles a plurality of connections in a circuit design layout for efficient routing.

It is another object of the present invention to provide a method and system for automatic bundling of connections which maximizes the realization of available bundling opportunities.

It is another object of the present invention to provide a method and system for automatic bundling of connections in highly selective manner.

These and other objects are attained by a method and system formed in accordance with certain embodiments of the present invention. One embodiment of such serves to selectively configure a circuit design having a plurality of component terminals for physical implementation. In accordance with the embodiment, a placement of components is established for a layout of the circuit design, and a plurality of connections to be routed between predetermined terminals of the components are defined for the layout, with a certain plurality of them selectively grouped into at least one candidate bundle. At least one filter is applied to the connections of each candidate bundle for responsive segregation according to a preselected connection discriminant into one or more updated bundle candidates. Each updated bundle candidate is preferably evaluated in accordance with at least one preselected bundling criteria to identify acceptable bundle candidates therefrom. Bundles corresponding to the acceptable bundle candidates are then generated.

BRIEF DESCRIPTION OF THE DRAWINGS

FIGS. 12A-12C are illustrations of a table created in a memory for sorting interconnections during an automatic bundling process consistent with the present invention;

FIG. 14 is an alternative table configuration for sorting interconnections in an automatic bundling process consistent with the present invention;

DETAILED DESCRIPTION OF PREFERRED EMBODIMENTS

Various aspects of the present invention will be described using terminology adapted to the field of circuit design and it is believed beneficial to the understanding of the disclosure to first define certain terms. It is to be understood that while the invention is described in terms of electronic circuit design, the applicability of the invention extends to other fields of endeavor where path finding and routing is involved.

As is used in the art, a "Design" is an Electronic Design Automation (EDA) database of information describing a Printed Circuit Board (PCB), an Integrated Circuit (IC) or an IC Package. A graphical representation of a portion of a Design is illustrated at 100 in FIGS. 1A-1B. A "Terminal" 105 is a location on one or more layers of a Design to which electrical signals may be connected. For a PCB, Terminals correspond to the pins, pads, and balls of the elements in the circuit. For an IC Package, Terminals are typically IC bumps or package balls. A Terminal may also be a junction point, such as a virtual pin or a T-junction. Multiple Terminals that are grouped together, such as depicted at 110, will be referred to as a "Component".

Figure 1A:
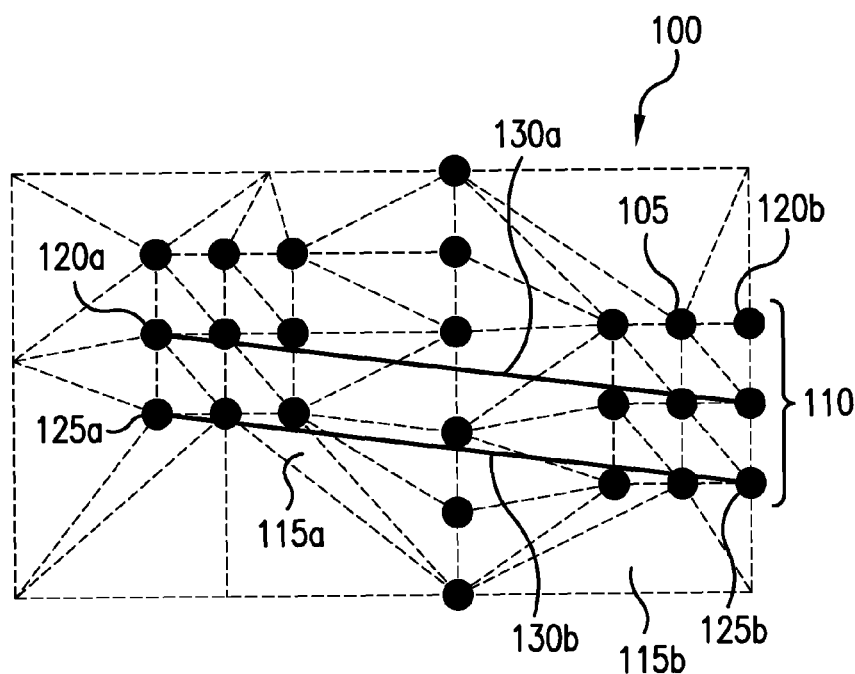
FIGS. 1A-1B are diagrams illustrating basic aspects of printed circuit design.
Figure 1B:
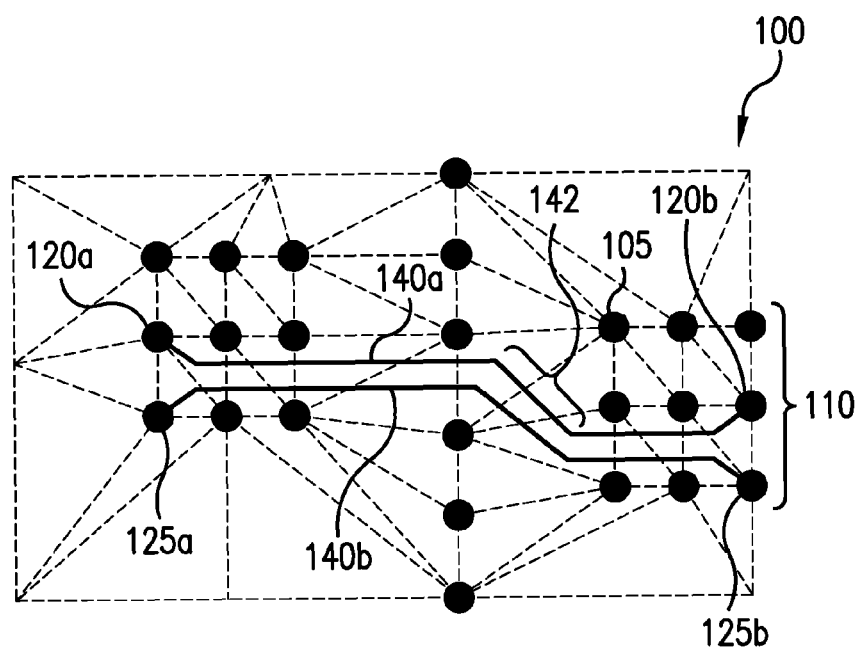

In FIGS. 1A-1B, there is shown a "Tessellation" of Design 100, i.e., the separation of the entire design space into distinct, non-overlapping regions, such as those shown at 115a and 115b. The regions in the exemplary embodiments described herein are triangular, but it is to be understood that the regions may be formed of other polygonal shapes, such as the rectangular regions of tessellation employed in traditional autorouters.

A "Rat" is a connection between two Terminals, i.e., a "Source Terminal" 120a, 125a and a "Target Terminal" 120b, 125b. A Rat may be unrouted, as shown at 130a, 130b of FIG. 1A, where the Rat has yet to possess geometric information defining its precise path in the Design, or a Rat may be routed as shown at 140a, 140b of FIG. 1B, where the Rat has complete geometric information specifying its ordered sequence of "Segments", an example of which is shown at 142. The Segment ordering is typically indexed or referenced starting at the Source Terminal 120a, 125a and ending at the Target Terminal 120b, 125b.

A "Net" is a collection of Rats connecting a collection of Terminals. In some cases, the specific connections between Terminals formed by certain Rats are predetermined. In other cases, the Rats are assembled into a Net in an order or "sequence" that is either established by the autorouter or is constrained by certain rules. For example, in the absence of any connectivity rules, the autorouter may change the collection of Rats as needed, provided the new collection still connects all of the Terminals of the Net.

Figure 2:
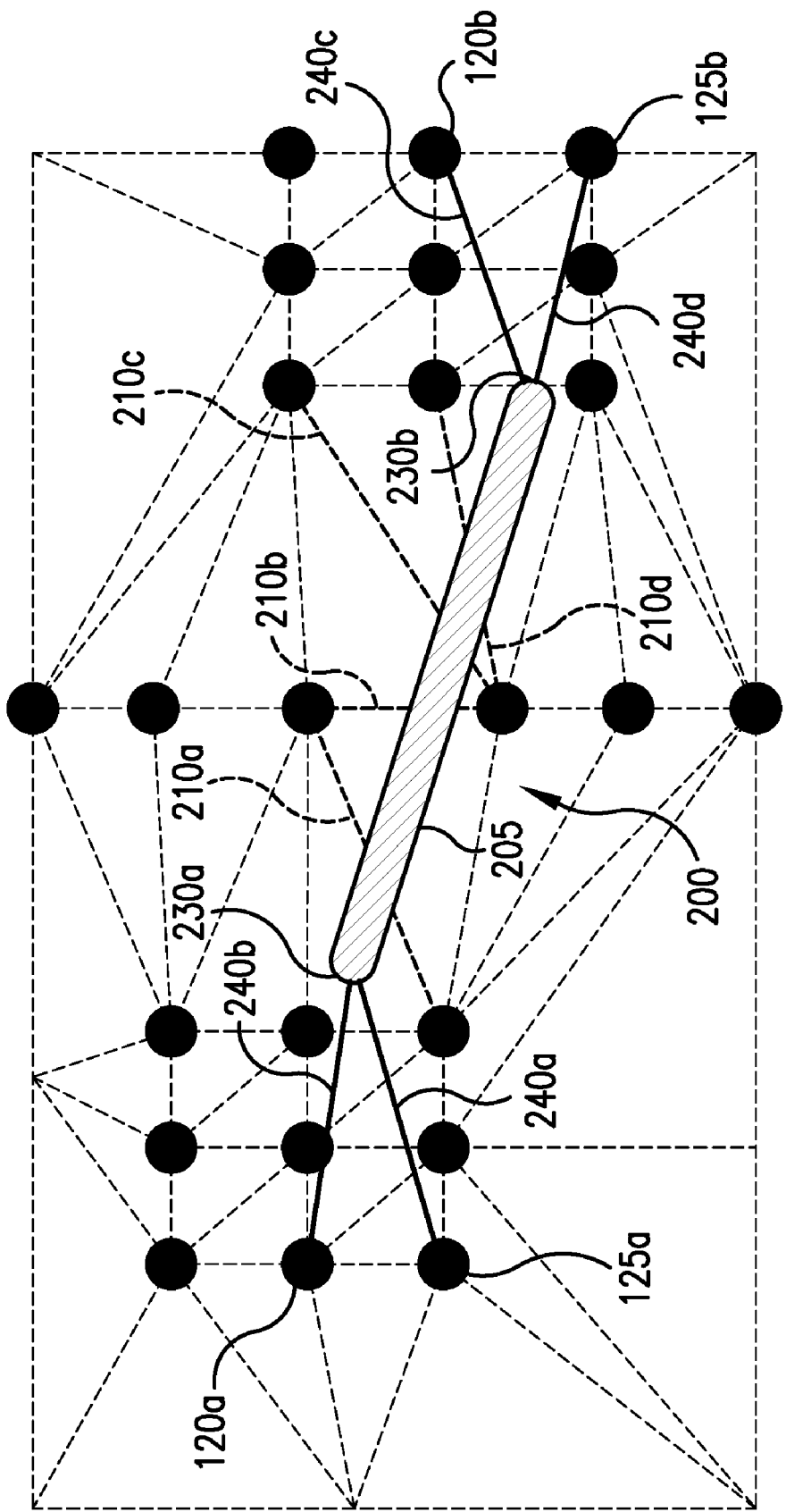
FIG. 2 is an illustration of a printed circuit layout including bundled rats in accordance with exemplary embodiments of the invention.

Referring now to FIG. 2, there is shown a "Bundle" 200, which, in accordance with one aspect of the present invention, is a collection of Rats determined by the designer or the autorouter to be routed together. In certain embodiments, a Bundle is displayed as a "Fat Rat", which, as described above, is a wide line indicating more than one Rat. The Fat Rat includes a plurality of "Rake Lines" 240a-240d extending therefrom. The Rake Lines 240a-240d graphically connect the Terminals 120a-120b and 125a-125b of the Rats 130a-130b to the Fat Rat 205 at a common location, referred to herein as a "Gather Point", as shown at 230a and 230b.

In accordance with the present invention, a "Flow" is a path for a Bundle, such as that illustrated by the traversal of Fat Rat 205 in FIG. 2. A Flow may be either active or inactive. An "Inactive Flow" is for graphical display purposes only and has no effect on autorouting, whereas an "Active Flow" provides geometric input to the autorouter to be used when autorouting Rats in that Bundle.

Figure 3:
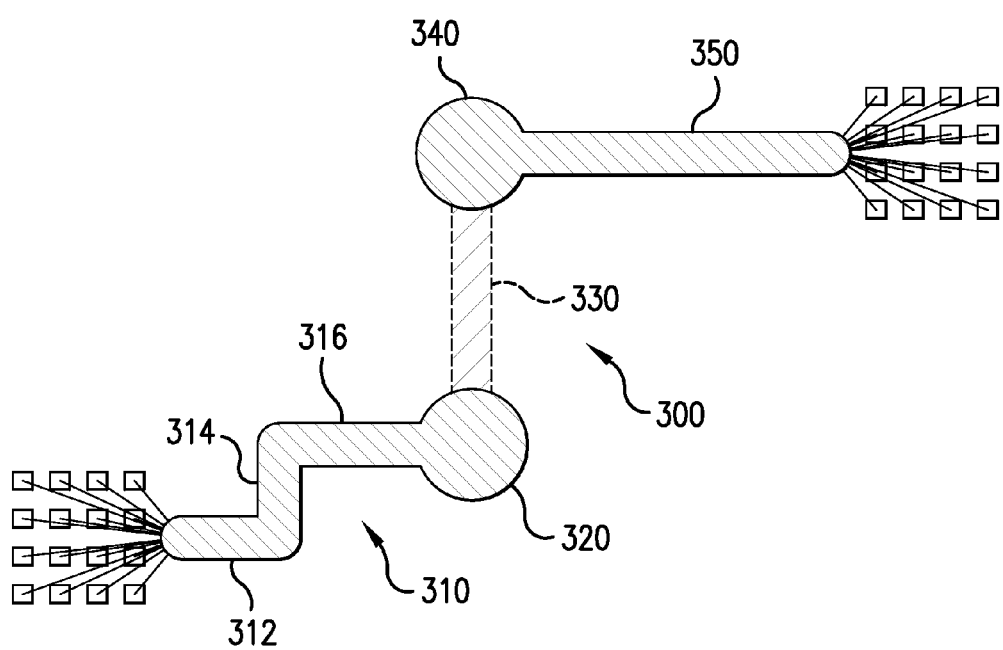
FIG. 3 is an illustration of an exemplary interconnection configuration consistent with aspects of the present invention.

Referring to FIG. 3, it is illustrated that a Flow includes one or more "Flow Lines" 310, 330 and 350 connected by zero or more "Flow Vias" 320, 340. A Flow Via indicates where vias should be placed when a Rat path needs to change routing layers. Each Flow Line includes one or more "Flow Segments", such as those illustrated at 312, 314 and 316 of Flow Line 310.

A "Portal", as used herein, is a side of a tessellation region and is often referred to in topological fields as an edge or a cut. In FIG. 2, the Portals shown at 210a-210d are traversed by the Flow indicated by the Fat Rat 205. It is to be noted that Terminals may or may not be on a boundary formed by the Portals.

Figure 4A:
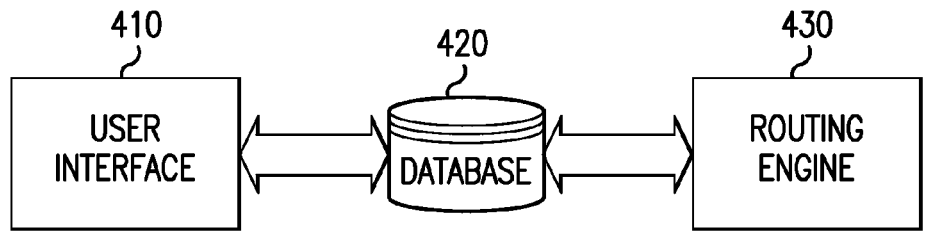
FIGS. 4A-4B are schematic block diagrams of exemplary system configurations suitable for carrying out the present invention.
Figure 4B:
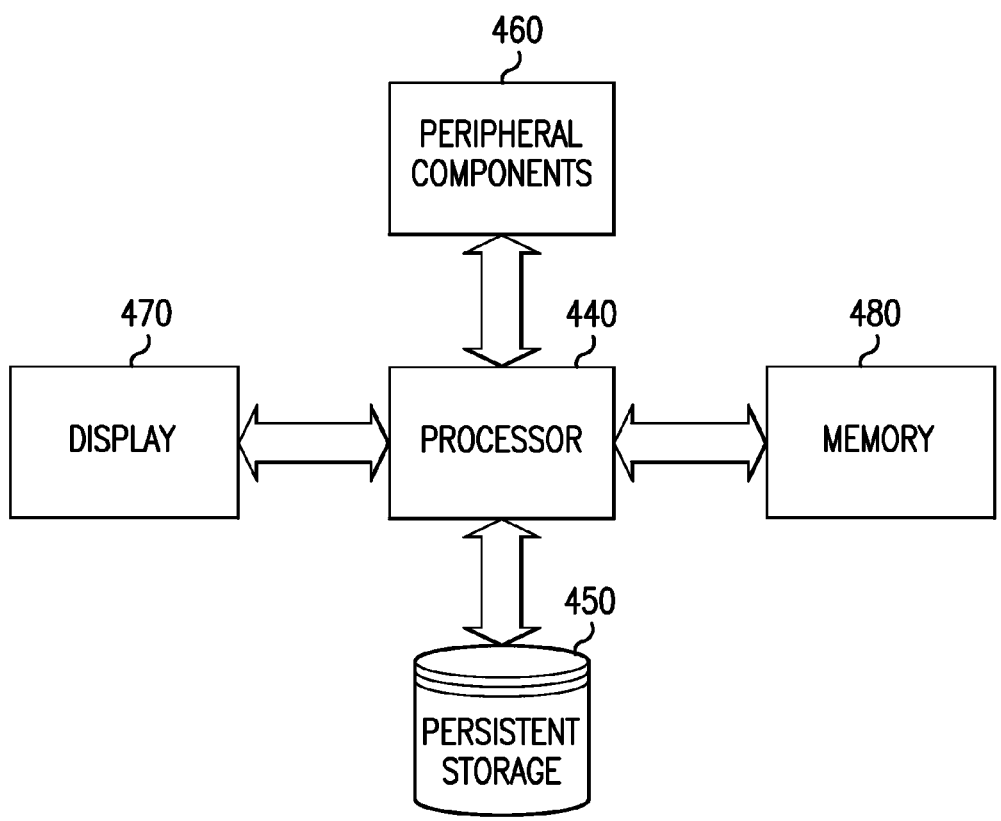

An exemplary embodiment of exemplary functional modules operable to carry out the invention are illustrated in FIG. 4A and may be implemented in suitable computing hardware such as that depicted in FIG. 4B. The data defining one or more Designs is maintained in database 420 and is presented to a user as one or more abstractions of that data through a user interface 410. A data abstraction is a conceptualization of the data reduced or factored so that a user may focus on only few pertinent aspects thereof. This is useful in circuit design in that the data may be viewed in a manner appropriate to the work task at hand. For example, an IC is generally viewed by a simple block symbol during a Component placement task and is viewed as an arrangement of its Terminals in a routing task. Through these data abstractions, the user is relieved of having to place and route the circuit in a view cluttered by the IC's constituent components, i.e., the thousands and possibly millions of transistors, resistors and other circuit elements forming the IC.

Database 420 implements a suitable structure on, for example, persistent storage system 450, for retaining data so as to be retrieved by its numerous data abstractions. Additionally, the database 420 is operable to store data that has been modified through any of its abstractions.

User interface 410 may be implemented through processor instructions stored in memory system 480 and executed by a suitable processor 440. The user interface 410 may be a graphical user interface operable to display the Design on a display 470 and to allow the user to add, delete and modify features of the Design through, for example, manipulation of certain peripheral components 460 coupled to processor 440.

Routing engine 430 executes path finding procedures to interconnect the Terminals of a Design. The routing engine 430 may be implemented through processor instructions stored in memory system 480 and executable by processor 440. The present invention is not limited to any specific router implementation. However, for purposes of describing an illustrative embodiment of the invention, the routing engine 430 embodies, for example, a "costed-wavefront" path finding mechanism. In such a router, paths are selected for each Rat by expanding through each tessellated region of the Design starting at its associated Source Terminal Each expansion forwards the Rat from one tessellated region to an adjacent region at an associated "cost" for the expansion. The cost for the expansion is a numeric value indicative of the relative difficulty of geometrically installing the path in the Design. The lowest cost sequence of such expansions from the Source Terminal (or an equivalent Source Terminal) to the Target Terminal (or an equivalent Target Terminal) is selected as the path for that Rat.

This is but one example of the various routing engine types which may be used, as the present invention is not limited to the use of any particular type. Indeed, any suitable routing approach known in the art may be employed. Examples of such include IDE (Iterative Deepening Expansion), line probe, global or switchbox, and the like.

Figure 5:
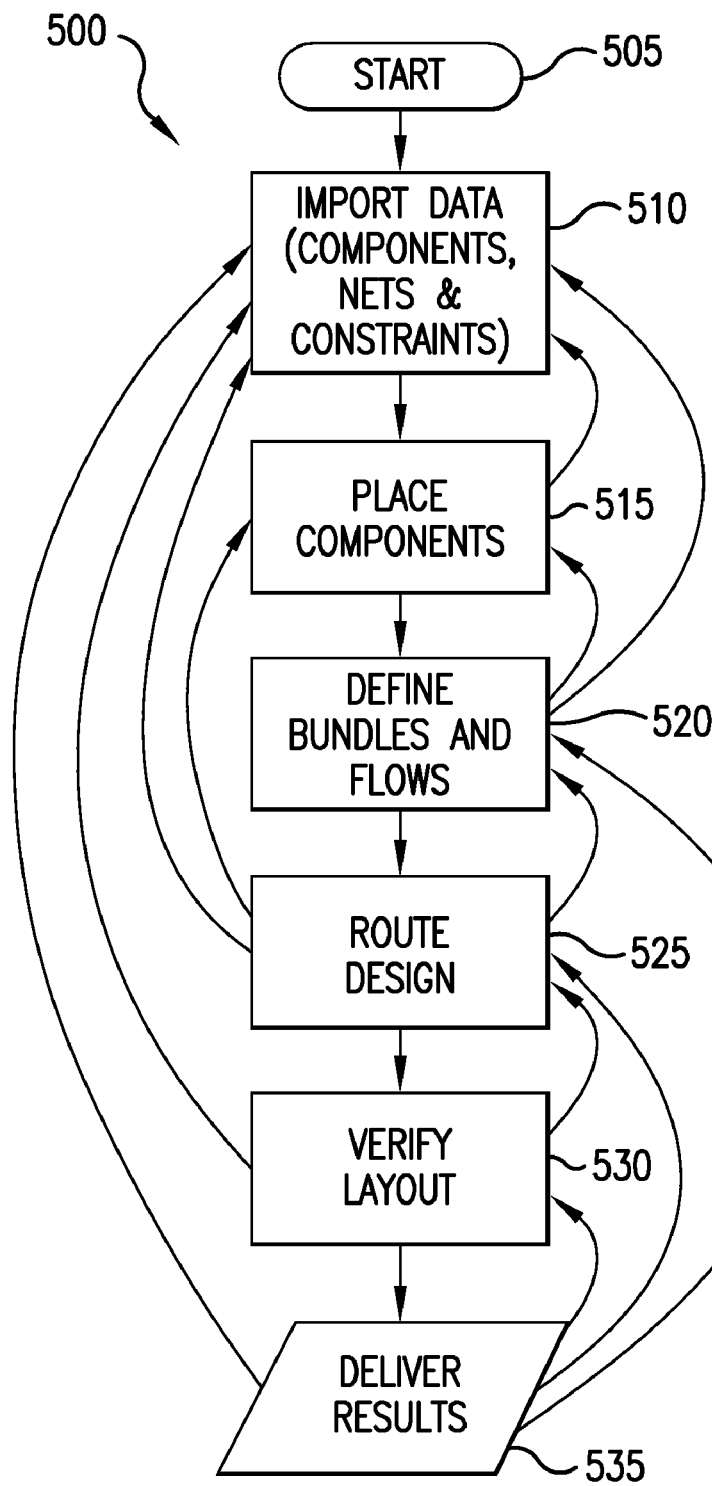
FIG. 5 is a process flow diagram illustrating execution of exemplary printed circuit design steps consistent with the present invention.

Referring to FIG. 5, there is shown a flow diagram of certain exemplary method steps in routing a Design in accordance with the present invention. The process is initiated at block 505 and progresses to block 510, where the Component and Net data are imported, typically from a schematics entry and editing process. Constraint information (delay/length limits, crosstalk limits, manufacturing rules, etc.) is also applied to the Design as entered into the database via the schematics entry and editing process, from a constraint managing process, from a design rules file or other suitable constraint entry mechanisms. Process flow then proceeds to the block 515, in which the designer places the Components into the Design, thereby specifying the locations in the Design for each Component.

Figure 6A:
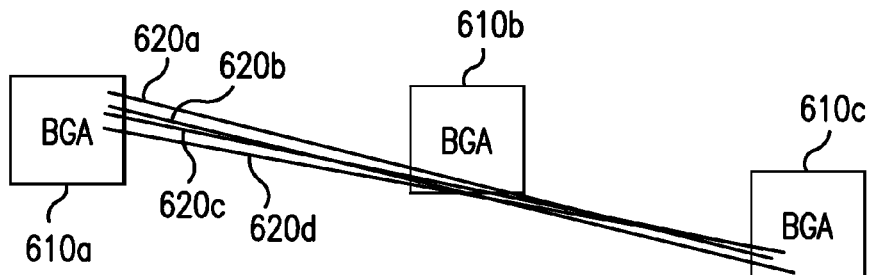
FIGS. 6A-6D are illustrations of certain printed circuit design steps consistent with the present invention.
Figure 6B:
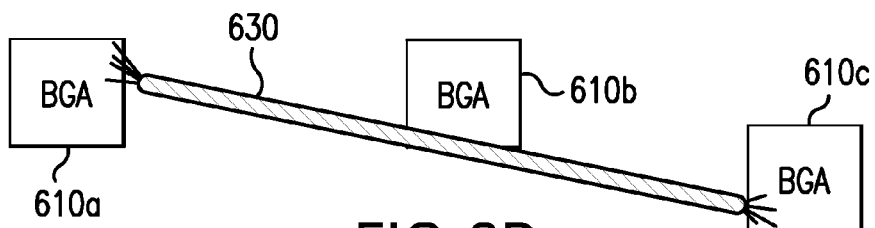
Figure 6C:
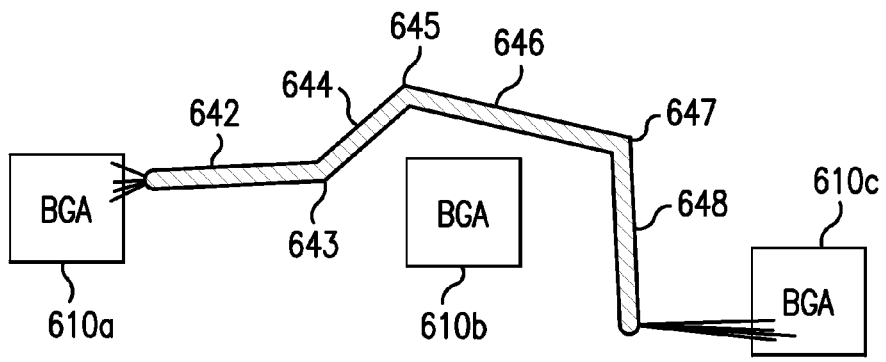

Once the Components have been placed, the process 500 continues to block 520, where the Bundles and Flows are defined. An exemplary configuration of Bundles and Flows as developed by process 500 is illustrated in FIGS. 6A-6D. The circuit arrangement of FIG. 6A represents a portion of a Design after Components 610a-610c have been placed therein. Rats 620a-620d each correspond to an interconnection between certain Terminals of Component 610a and certain Terminals of Component 610c. In FIG. 6B, the Rats have been assigned to a Bundle, which is indicated by the Fat Rat 630. The assignment of Rats to Bundles may be accomplished in more than one way, as will be described below. Next, as is shown in FIG. 6C, a Flow 640 has been defined for the Bundle 630. The Flow includes Flow Segments 642, 644, 646 and 648, each joined one with another at vertices 643, 645 and 647 and defining a Flow path to circumvent Component 610b. It is to be noted that a Flow may also include Flow Vias and numerous Flow Lines, as described above. Without the benefit of the present invention, the procedure indicated at block 520 would be performed in the designer's head or sketched on paper or using a separate computer application. The present invention not only allows the plan to be developed in concert with other EDA tasks, but the planning information is retained and used to guide the routing engine to route the Rats in accordance with the designed plan.

Returning to FIG. 5, the Design is routed by the routing process indicated at block 525. The routing engine 430 creates the geometric paths for each Rat using segments on a particular layer and vias for establishing connections between layers, in accordance with not only the constraints entered directly into the Design, but also in accordance with the Flows established in block 520.

Figure 7:
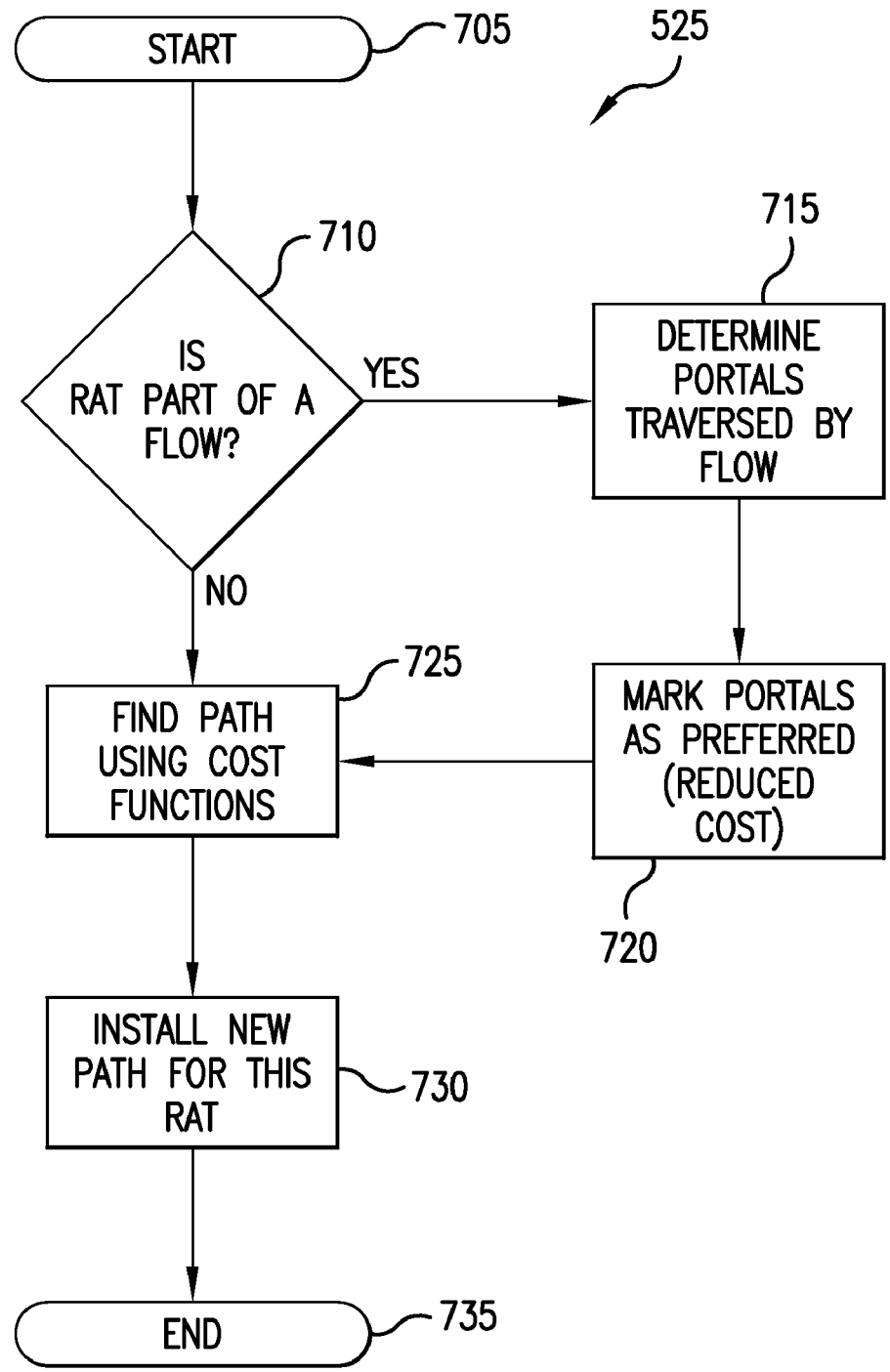
FIG. 7 is a process flow diagram illustrating execution of exemplary circuit routing steps in accordance with embodiments of the invention.

An exemplary routing process 525 operatively consistent with the present invention is illustrated in FIG. 7. The procedure is entered at block 705 and proceeds to decision block 710, where it is determined if the Rat being routed is a member of a Flow. If not, the Rat is routed separately using the costed-wavefront path finding routine, as indicated at block 725, and then installed into the Design in accordance with the path having the least cost, as indicated at block 730. If, however, the Rat is a member of a Flow, it is determined at block 715 which Portals are traversed by the Flow. The traversed Portals are referred to herein as "Preferred Portals" for Rats that are part of a traversing Flow and, in accordance with certain embodiments of the invention, expansion across Preferred Portals for those Rats is done at a reduced cost. In certain embodiments of the invention, the cost for expanding across Preferred Portals is reduced to zero. The routing procedure then proceeds to block 725, where the path is found having the lowest cost. For Rats that are members of an Active Flow, the path finding routine or the routing engine is biased by the reduction in cost towards traversing the Preferred Portals. The paths for those Rats are geometrically installed by the routing engine in regions of the Design set forth by the designer's plan. However, it is to be noted that other routing constraints entered into the Design may resolve into routed paths that do not strictly conform to the Active Flow, but the guidance provided by the designer will influence the routing with most often satisfactory results.

Figure 6D:
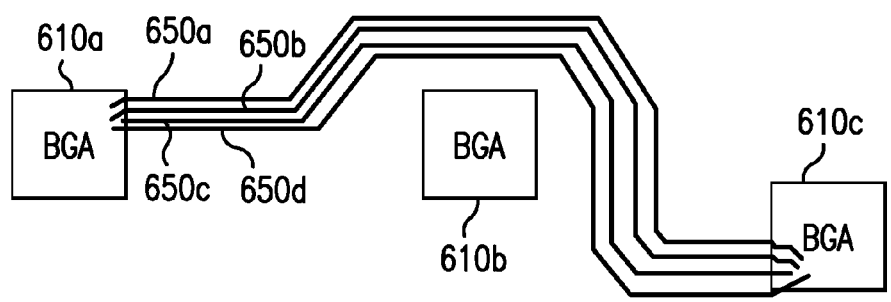
Figure 8:
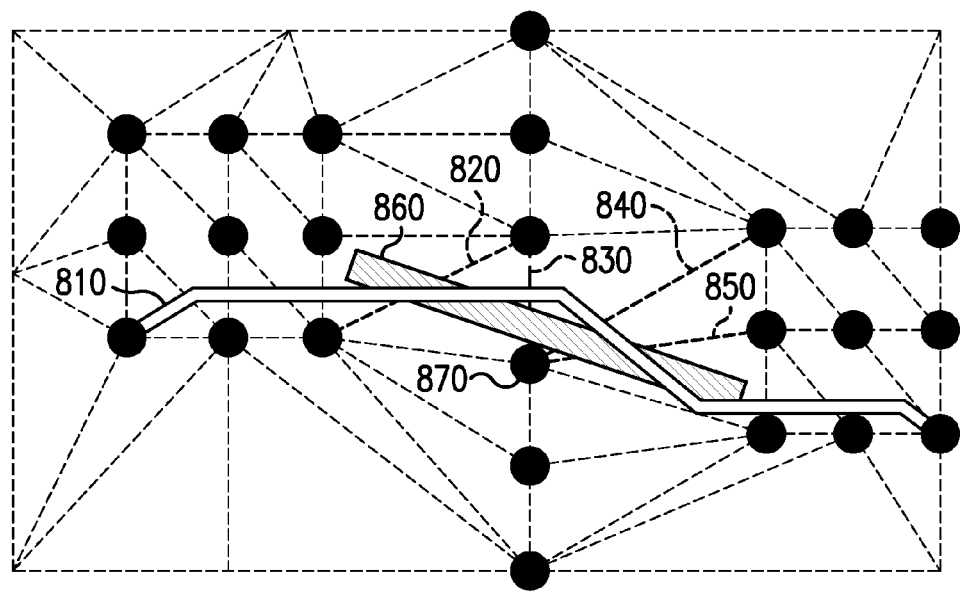
FIG. 8 is an illustration of an interconnection routed in accordance with present invention.

The guided routing in one embodiment of the present invention is conceptually illustrated in FIG. 8, where Rat 810 has been routed in accordance with Flow 860. Many other paths for Rat 810 are possible and absent any other information, such as the set of Preferred Portals 820, 830, 840, 850, defined by the traversal of Flow 860, the Rat could have been routed in other areas. Note that the path 810 is established above Terminal 870 because the cost of expansion to areas below the Terminal 870 is higher than that of expansion to areas above the Terminal, even though the length of the routed Rat could have been made the same. The lowest cost was set by the Preferred Portals 830, 840 and 850. An example of Rats routed in accordance with the exemplary Flow described with reference to FIGS. 6A-6C is illustrated in the example of FIG. 6D.

After routing, the design process 500 of FIG. 5 proceeds to block 530, in which the signal integrity of the Design is verified. This may be accomplished through suitable simulations on the Design to verify that all of the constraints and other requirements have been met. The process flows to block 535, where the verified Design is delivered to a receiving entity, such as a manufacturing facility or a corporate repository of Designs.

As is demonstrated by the multiple arrows of process flow in FIG. 5, the design process 500 is rarely straight forward or completed in a single pass through the process steps. Multiple iterations of various steps of the process must be performed. For example, the first routing attempt is unlikely to be the final routing attempt and a return to a previous step will often be necessary. Even when a design is completed and delivered, the process may have to be revisited, such as when an Engineering Change Order (ECO) is issued due to testing or to a requirements change. In a significant departure from the prior art, the Bundle and Flow information is maintained in the Design database in a suitable manner similar to that of any other element in the Design. The Bundles and Flows may be presented through various data abstractions, such as the Fat Rat, and manipulated through the user interface just as other data members are abstracted and manipulated in accordance with the task at hand. Without Bundles and Flows, the entire design process might need to be restarted, whereas with Bundles and Flows of the present invention, most of the prior design effort may be preserved. The autorouter may simply restart from previously defined Bundles and Flows using the new components, nets, and constraints to revise the Design.

During component placement and thermal analysis phases of design development, users may by way of the invention more easily visualize the connectivity of the components to each other. Since part of this step involves planning the anticipated interconnect density against the available free space, designers may take into account space for interconnects by establishing Flows during the placement phase. It becomes possible to logically group components together so as to move groups together as individual units and visually see the effects. In autorouters of the prior art, autorouting tools have very little value during placement, because the design is in such early stages and only incomplete lists of components and nets are available. Traditionally, autorouting is impossible without, at the very least, a complete set of components. Spatial planning early in the design cycle by way of the present invention saves time in later development phases, since insufficient space normally requires potentially painful placement changes, which require associated manufacturing approval all over again.

Similar benefits are achieved by the invention during constraint development, where the component list and the net list are typically still incomplete. As with placement, this has a major impact on the final location of components and current automation tools, which merely view connections as discrete and unrelated to each other, do not assist in planning for spacing requirements.

Figure 9:
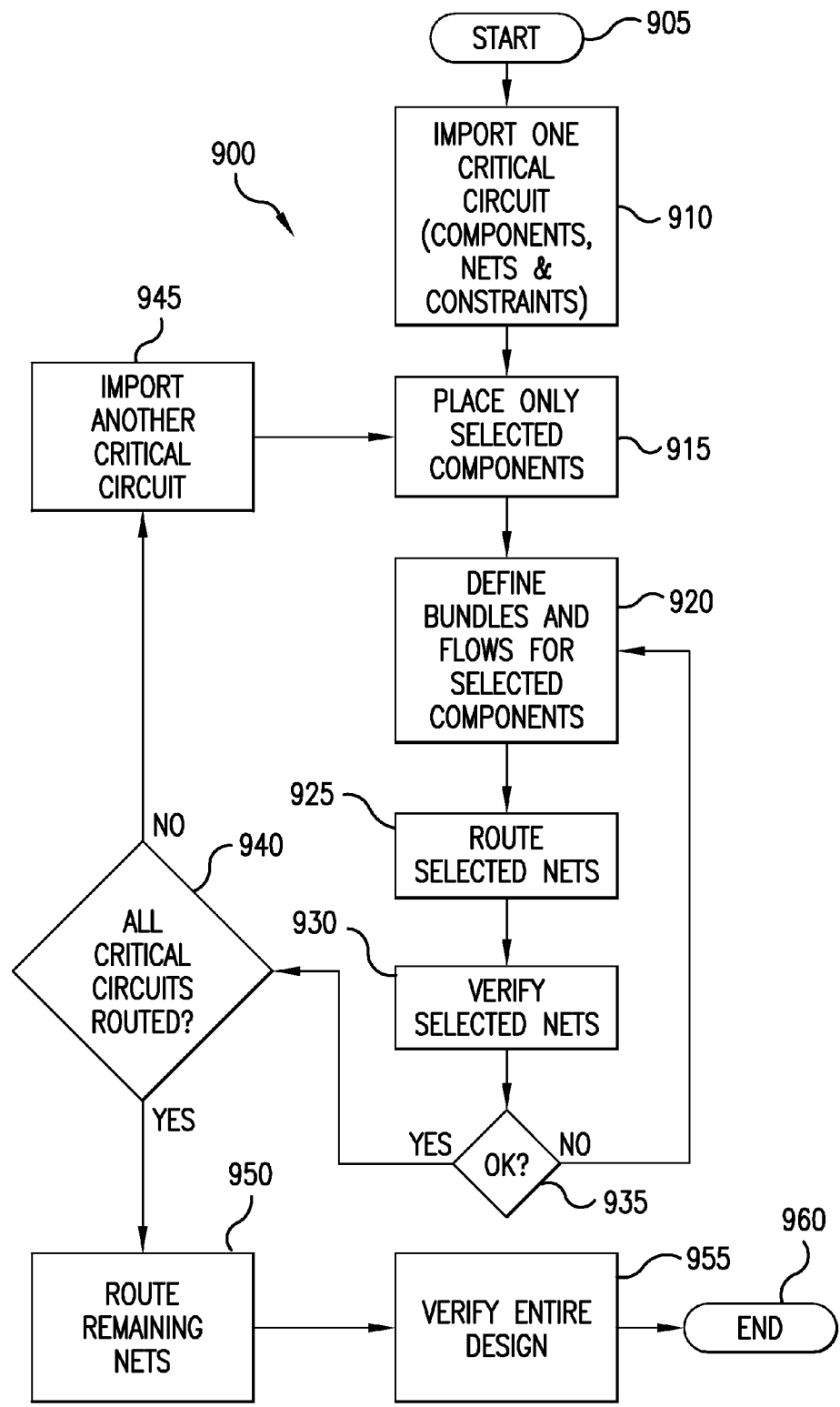
FIG. 9 is a process flow diagram illustrating execution of an incremental printed circuit layout and routing process consistent with the present invention.

Incremental development of a Design in accordance with the invention is illustrated in FIG. 9. Upon entering the process 900 at block 905, process flow is transferred to block 910, where the Components, Nets and constraints of one critical circuit are imported into the Design. Certain of the Components are selected and placed, as shown at block 915, and Bundles and Flows are created for the selected Components, as shown at block 920. Selected Nets are routed, as shown at block 925, and verified, as shown at block 930, and it is then determined if the selected critical circuit is within design specifications, as indicated by decision block 935. If not, process flow is transferred back to the bundling step of block 920 for refinement. If the circuit is verified as being within specified parameters, it is then determined if all circuits have been routed, as indicated at decision block 940. If more circuits are to be placed, the process 900 is transferred to block 945, where the circuit elements are imported and is placed by the process of block 915. If it is established at block 940 that all critical circuits have been routed, remaining nets are routed, as indicated at block 950. The remaining nets will include those connections not forming the individual critical circuits, including nets that join such circuits. Once all Nets have been routed, the entire Design is verified, as shown at block 955, and the process 900 is exited at block 960.

Figure 10:
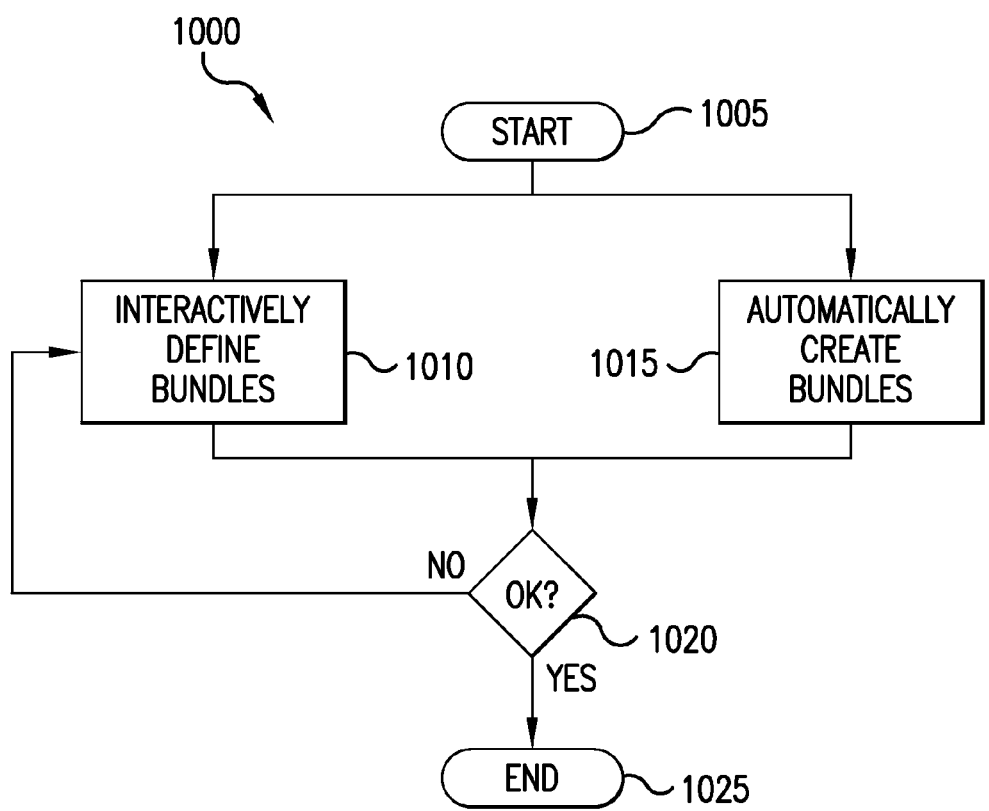
FIG. 10 is a process flow diagram illustrating bundling of interconnections of a printed circuit design in accordance with the present invention.

The present invention preferably implements various means for associating certain interconnections together into Bundles. Referring to FIG. 10, there is shown a flow diagram of an exemplary bundling process 1000 of the present invention, which is entered at block 1005. Because there are typically many potential Bundles in a Design, a user might first allow the autorouter to automatically create the Bundles, as shown at block 1015. Because the Bundle definition process is extremely fast compared to the time to route the design, the user might alternatively choose to interactively create each Bundle, as shown at block 1010. It is then determined at block 1020 if the resulting Bundles meet the user's requirements and, if so, the process is exited at block 1025. In most cases, however, the user will need to interactively create or modify the resulting Bundles by returning to the interactive bundling process of block 1010 and reevaluating thereafter. In fact, the user may return to the interactive bundling stage at any later time during the entire process to make minor adjustments to the Bundle assignments.

Interactively creating Bundles may be accomplished using any of various suitable interactive user interface techniques that allow several Rats to be selected together. In one embodiment, a mechanism is provided whereby the user graphically selects a set of Rats and assigns them to a Bundle using a menu or mouse click command. The same techniques may enable the user to modify Bundles. For example, using mouse clicks or menu commands, the user could select an existing Bundle and then select a specific Rat to add to that Bundle or select a Rat to remove from that Bundle. Other interactive mechanisms are possible, such as specifying Bundles and/or Rats by symbol or by name.

Figure 11:
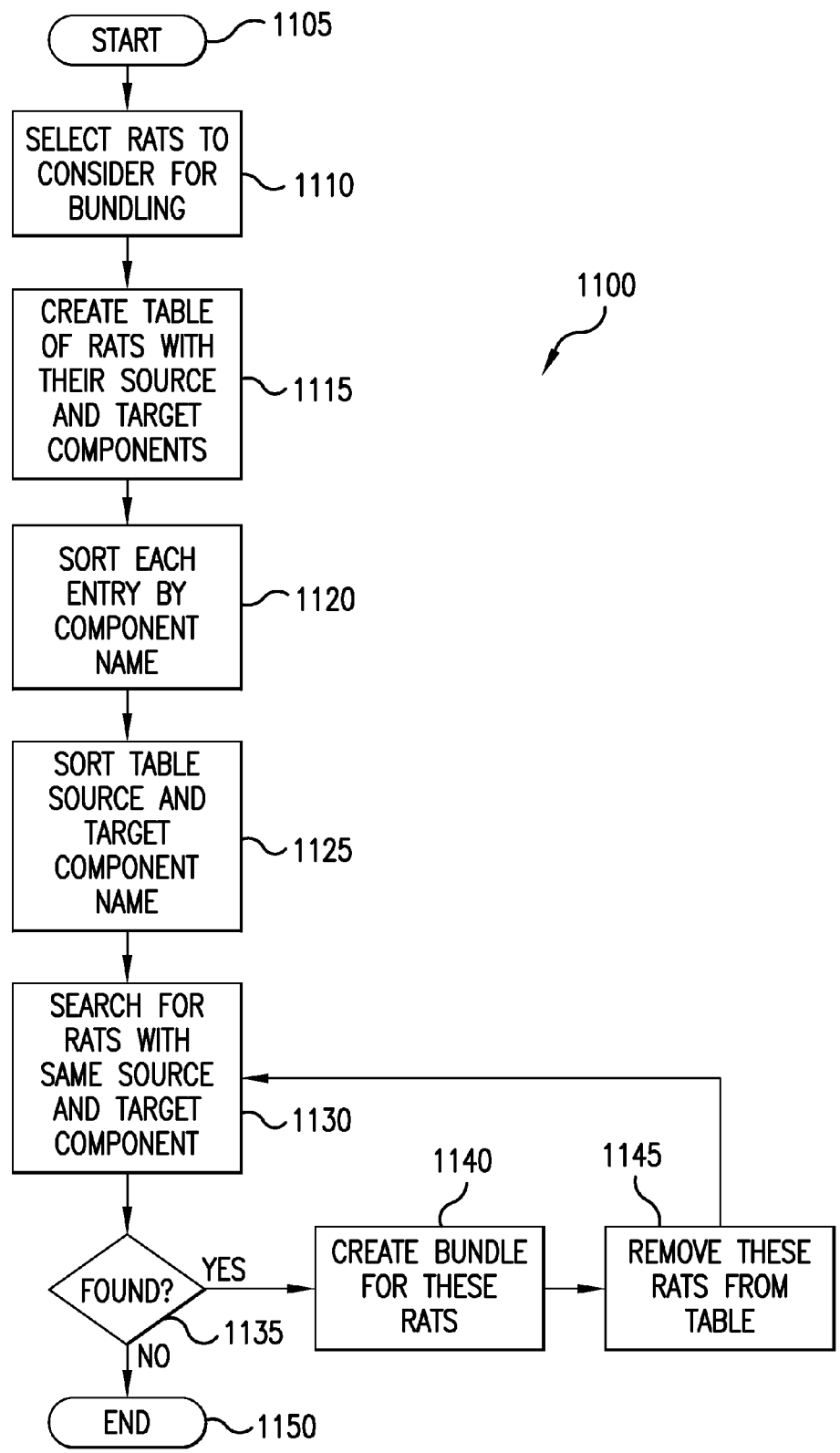
FIG. 11 is a process flow diagram illustrating an exemplary automatic bundling process in accordance with the present invention.

There are various mechanisms by which Bundles may be created automatically by the autorouter. In certain embodiments of the present invention, Component information may be used to automatically create Bundles, such as in the exemplary procedure 1100 illustrated in FIG. 11. The process 1100 is entered at block 1105 and flow is transferred to block 1110, where Rats are selected as candidates for Bundles. This could be all Rats that are not yet part of a Bundle or the candidate set could be interactively selected by the user prior to starting automatic bundling process 1100. The process 1100 continues at block 1115 where a table is created in memory that contains the Rat identifier and the identifiers for the corresponding Source and Target Components whose terminals are connected by this Rat. Such a table is illustrated in FIG. 12A, where the entry into the table is identified by the Table ID. The Rat ID entries take the form XX.P:YY.P, where XX is the Source Component, YY is the Target Component and P is the associated Terminal or pin number of the corresponding Component. The Component 1 and Component 2 entries are the Component designator in the Design of the Source and Target Components. Flow of process 1100 then progresses to block 1120, where the last two columns of each row of the table are sorted by Component name. This is illustrated in FIG. 12B, where it is to be observed that the Component 1 and Component 2 entries at 1220 and 1222 have been switched. This sorting operation allows the procedure to ignore which end of the Rat corresponds to the Source Component and which end corresponds to the Target Component. The procedure 1100 proceeds then to block 1125, where the rows of the table are sorted by first and second Component name, which groups similar Rats together in the table. The grouping is illustrated in FIG. 12C, where entries at 1230 and 1232 respectively interconnect the same two components. Flow of process 1100 is transferred to block 1130, where the table is searched for a sequence of Rats with the same first and second component, which is referred to as a "Bundle Candidate". If any Bundle Candidate is found, as determined at decision block 1135, a Bundle is created for those Rats, as shown at block 1140, and the bundled Rats are then removed from the table, as shown at block 1145. The procedure 1100 is repeated at block 1130 until all Bundle Candidates are found and the procedure 1100 is ultimately terminated at block 1150.

In certain embodiments, a decision is made at block 1140 as to which Bundle Candidates should be forwarded to create a Bundle, such as on the number of Rats in the Bundle Candidate. For example, certain embodiments of the invention will create a Bundle from a Bundle Candidate if there are four (4) or more Rats in the Bundle. If there are three (3) or fewer, no Bundle is created and the Rats are routed separately in the appropriate manner.

Figure 13:
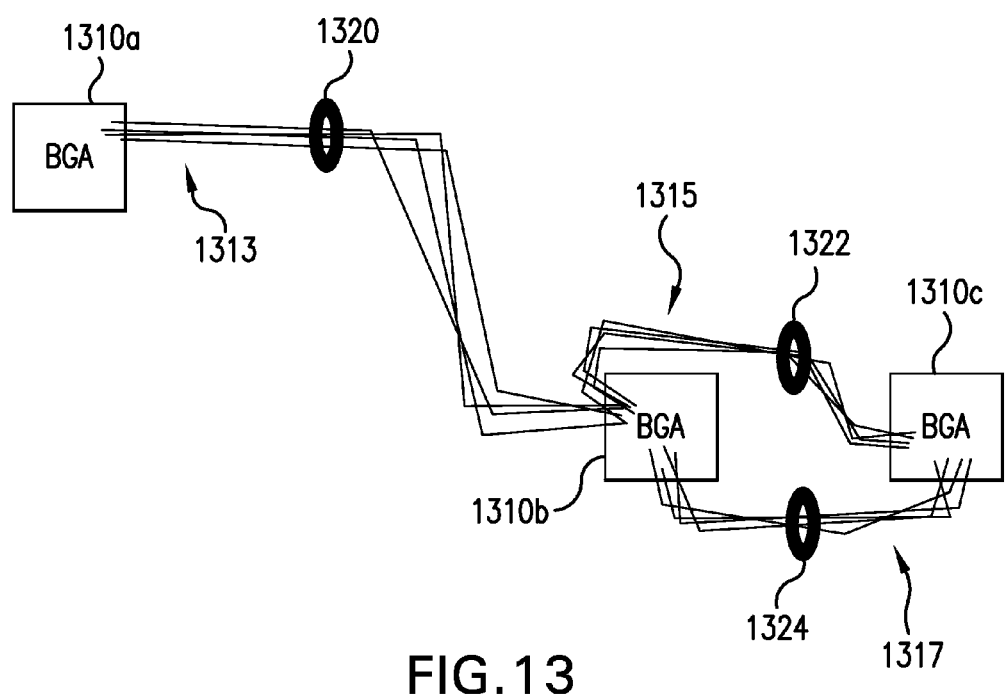
FIG. 13 is a diagram illustrating a printed circuit design planning stage in accordance with the present invention.

Another alternative embodiment of the invention uses planned routing information as part of the decision logic. Referring to FIG. 13, there is shown a planned Design configuration where the user has placed three Components 1310a-1310c and planned Rats 1313, 1315, 1317. The entry/exit side for the planned Rats indicated at 1313, 1315, 1317 is extracted and placed in additional columns of the table in memory, such as is shown in FIG. 14. The table may then be sorted in step 1125 of FIG. 11 in accordance with the entry/exit side such that the Rats with the same entry/exit directions will be adjacent in the table. The Bundle Candidates may then be selected in step 1130 to include only Rats with the same components and the same entry/exit directions. For example, in FIG. 13, Bundles 1320, 1322 and 1324 may all meet criteria of common components, but Bundles 1322 and 1324 would produce two separate Bundles, as opposed to one combined Bundle, because their entry/exit information is different.

An alternative mechanism for assigning Rats to a Bundle is to use Bus information. A "Bus" is a user-defined collection of Nets, which are frequently generated through a schematic editor. It is common for users of schematic editing packages to define a Bus to reduce the clutter on the schematic. It is also common for signal integrity engineers to define a Bus for the purpose of assigning constraint properties to a set of related Nets. Unfortunately, Busses are defined on Nets, which may have many Rats. It therefore provides little or no benefit to combine all of the Rats of a Net into a Bundle, since the Rats of the Net would be on different areas of the design. The disclosed embodiment of the present invention would use additional information when creating Bundles from Bus information. For example, certain embodiments of the invention would extract the bus name corresponding to the Rats and place the bus name in an additional column of the memory table described above. When the table is sorted in block 1125 of FIG. 11, for example, Rats having the same bus name will be grouped together in adjacent rows. The Bundle Candidates may then be selected in block 1130 to include only Rats connecting the same components and by the same named bus. Variations of this procedure would prevent adjacent Rats of the same Bus from being placed in two different Bundles or allow adjacent Rats of the same Bus to be placed in two different Bundles. Another variation is to prevent or allow joining Rats of two different Buses into the same Bundle.

The present invention preferably makes possible, among other things, assigning properties to a Bundle. For example, the layer or layers to be used for a Bundle may be specified. The Bundle may also have a "packed/unpacked" property, where, if packed, the autorouter routes the Rats of the Bundle as close together as the spacing constraints allow and, if unpacked, the router spreads the paths apart, evenly distributing whenever space is available. Other properties may be added to each Bundle to provide additional guidance to the autorouter, even if no Flow information is provided.

In an exemplary embodiment reflecting certain alternative approaches in this regard, one or more candidate bundles are quickly and conveniently refined and reconstituted, where necessary, in accordance with one or more user-specified connection filtering discriminants. That is, each candidate bundle obtained is effectively "filtered" by examining its constituent connections in light of one or more preselected connection discriminants and accordingly segregating such connections into one or more updated bundle candidates. The resulting updated bundle candidates are preferably evaluated in view of at least one preselected bundling criteria to determine whether or not they are acceptable for actual bundling. If acceptable, corresponding bundle generation proceeds for the given updated bundle candidate; otherwise, the given candidate is discarded from the pool of bundle candidates. This enables a user to explore various bundling scenarios by specifying various connection filtering discriminant and/or bundling criteria options and observing the bundling sets resulting as candidates therefrom, before actually committing to a particular bundling set for routing.

Preferably, a plurality of connection filtering discriminants is employed to successively refine the pool of candidate bundles to an optimally updated set. Grouping connections for bundling based simply upon terminals of matching components coupled at both ends, for example, may fail to include numerous other 'bundle-worthy' connections not satisfying this particular connection requirement. For instance, connections which share but one or even no commonly coupled component in this manner may nonetheless share significant intermediate stretches traversing the same portals defined for the given layout. Such connections may prove quite conducive to bundling for that reason, yet be overlooked as viable bundling candidates.

In accordance with one exemplary embodiment of the present invention, therefore, the pool of candidate bundles—which in the simplest case may initially include all the available connections of the given layout—is subjected to 'filtering' for discrimination of its connections into one or more newly-refined bundle candidates, the filtering being based upon one or a coordinated set of various connection-distinguishing factors. Either during the processing for such filtering, or at some suitable point thereafter, each newly-formed bundle candidate is preferably also evaluated as a bundle against certain user-selected requirement(s) for an acceptable bundle candidate. An actual bundle definition is then created for a candidate bundle which results from the filtering process and satisfies the bundling requirement(s).

Figure 14A:
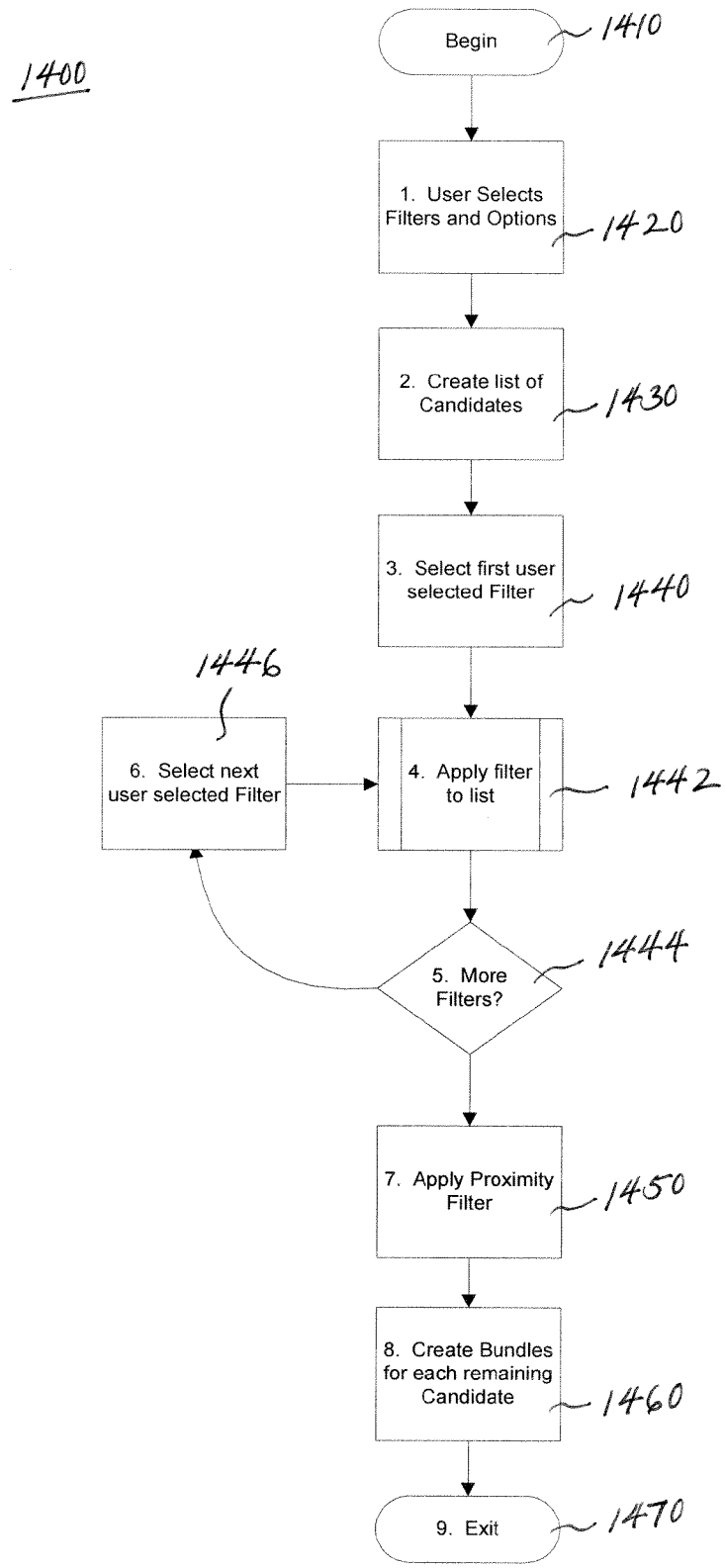
FIG. 14A is a process flow diagram illustrating an exemplary bundle filtering process in accordance with one embodiment of the present inventions.
Figure 14B:
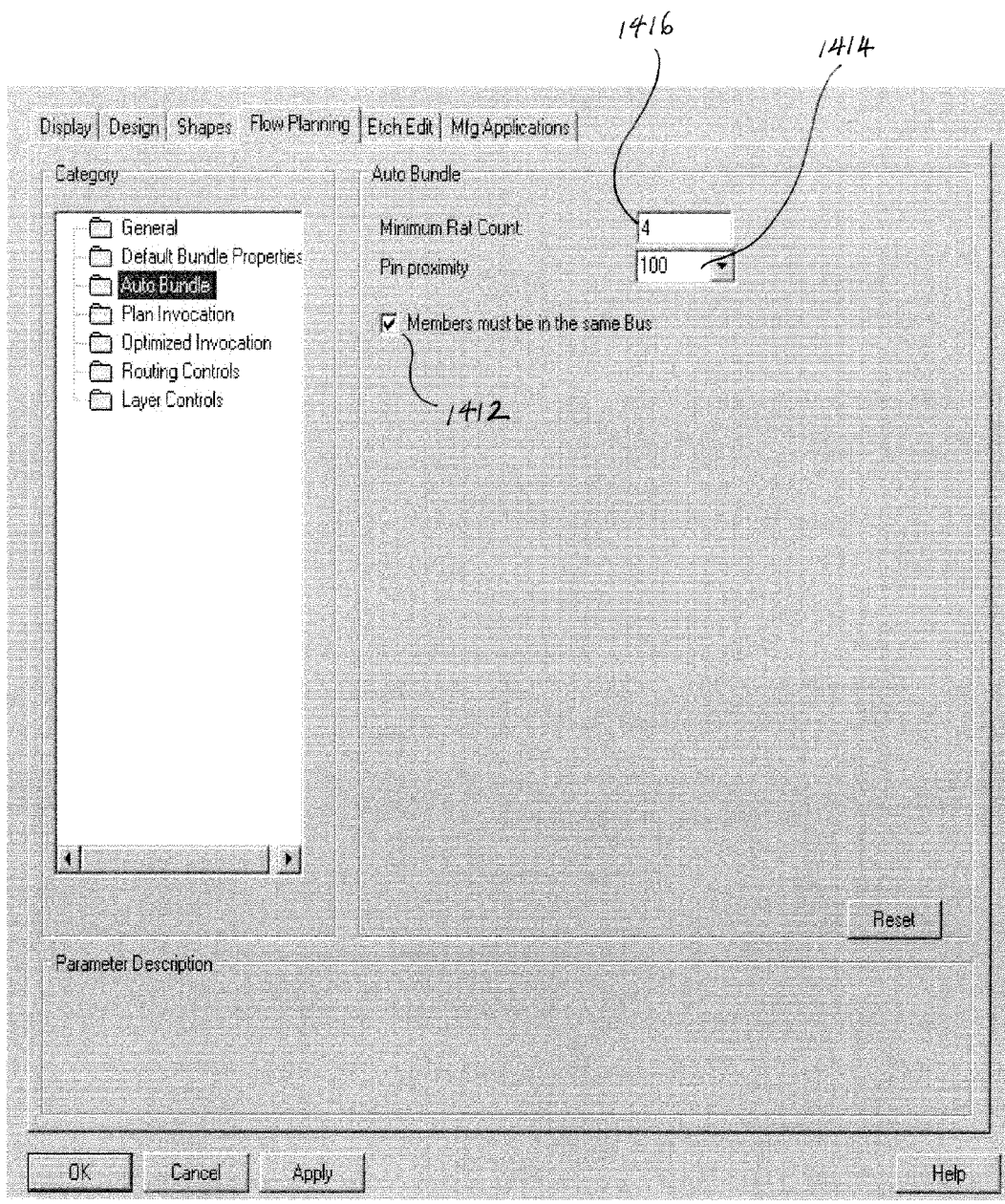
FIG. 14B is a schematic diagram illustrating an example of a user interface which may be employed for user-selection of entries in one embodiment of the present invention.

Referring to FIG. 14A, there is illustrated a flow diagram of a bundle filtering process 1400 which may be carried out in accordance with the present exemplary embodiment. The process begins at block 1410, with a user preferably provided at block 1420 with an opportunity to select one or more filters and other optional criteria to be applied to candidate bundles. FIG. 14B illustrates one example of a user interface by which a user may interactively set such selections. In the illustrated example, the user is prompted to selectively enable/disable a Same Bus filter selection 1412, as well as to selectively configure a Pin Proximity filter selection 1414. The user is also prompted to specify the Minimum Rat Count criteria 1416 to be met for an acceptable bundle. Various other filter types and bundling criteria may be used in certain other applications in place of, or as a supplement to, those illustrated. The actual choice of filters, their connection filtering discriminants, and bundling criteria to be employed will depend on the particularities of the intended application.

Referring back to FIG. 14A, one or more bundle candidates are created in suitable manner to each define a collection of connections, or Rats. The initial creation of such bundle candidates occurs automatically, based preferably upon any user selection of particular Rats or Nets of components which may be available. To guard against unduly burdensome numbers and/or sizes of bundle candidates, a preliminary check may be made of all the connections in the circuit design, or at least of all connections which may have been selected by the user, so as to include in the initial candidate bundles only those connections which could conceivably meet certain of the given filtering discriminants. In the simplest case, all the connections could be included in one initial candidate bundle.

In the disclosed embodiment, a master list of candidate bundles is preferably created along with an initially empty out list of candidate bundles at block 1430. The user-selected filter is then identified and applied at blocks 1440, 1442 to the connections of each candidate bundle found in the master list. Where more than one filter has been selected for application, the filters are applied in succession, each operating upon the bundle candidates yielded by the preceding filter. The current candidates' connections in the embodiment shown are segregated according to the applied filtering discriminant into one or more updated bundle candidates which are preferably collected in the out list as they are formed. Once the filter application is complete, the candidate bundles of the master list are replaced with the updated bundle candidates of the out list, and the out list thereafter emptied for any further filter application.

As illustrated at block 1444, a check is made for additional filters requiring application. If found, the next user-selected filter is identified at block 1446 and applied at block 1442 to the updated bundle candidates now occupying the master list. The further updated bundle candidates resulting from this subsequent filtering are again collected in the out list, then passed on as the new master list upon completion of the filter's application.

In accordance with one embodiment of the present invention, examples of the various filters which may be used alone or in combination with one or more of the others include (but are not limited to): a Same Bus filter, a Same Layer Set filter, a Same Match Group filter, a Same User Selected Property filter, a Same User Selected Constraint filter, a Two Common Components filter, a One Common Component filter, and a Proximity filter. The type and number of filters which may be employed in accordance with the present invention are not limited to these filters, and various other effective filters employing other suitable connection discriminants may be used if necessary to better adapt the bundling to the particular requirements of the intended application.

The Same Bus filter examines each connection of a candidate bundle (or subsequently updated bundle candidate) and distinguishes those connections which are commonly assigned to the Same Bus in the given layout of the circuit design. The filter segregates those connections belonging to different buses into separate bundle candidates for further processing.

The Same Layer Set filter examines each connection of a candidate bundle (or subsequently updated bundle candidate) and distinguishes those connections having the Same Layer Set associated therewith. That is, connections sharing potential implementation on the same set of possible layers in a multi-layered circuit design layout are grouped together and segregated by the filter from other connections into a corresponding bundle candidate for further processing.

As described in preceding paragraphs in connection with preceding embodiments, certain of the connections in the given layout may belong to more than one connection group having a shared range of values for certain parametric resources pertaining thereto. The connections commonly belonging to a particular Match Group in this manner are flagged, labeled, or otherwise indicated as such. The Same Match Group filter examines the connections of a candidate bundle (or updated bundle candidate) to sort and thereby segregate them by their respective Match Group designations.

Preferably, a user is offered the option of specifying as a connection discriminating feature one or more particular connection properties and corresponding values in view of the circuit design layout. The user is preferably also offered the option of specifying as a connection discriminating feature a particular constraint for certain parametric resources. Examples of such properties and constraints which may be user-specified as filtering discriminants include: Maximum Delay, Minimum Delay, Matched Via, Minimum Via, Maximum Via, Impedance, Maximum Crosstalk, Maximum Peak Crosstalk, Maximum Total Etch Length, Maximum Exposed Etch Length, Voltage, Component Attribute String, Pin Attribute String, Net Attribute String, and the like.

Each of the filters for Same User Selected Property and Same User Selected Constraint examines the connections of a candidate bundle (or updated bundle candidate) to discriminate and accordingly segregate those connections sharing the user-specified property or constraint values into respective bundle candidates.

The Two Common Component filter examines the connections of a candidate bundle (or updated bundle candidate) to distinguish those connections extending between terminals of the same two components in the circuit design layout. This filter operates in much the same manner described in connection with preceding embodiments, wherein the connections are sorted according to their associated component names and segregated into respective bundle candidates for further processing. It is to be understood in this regard that a connection extends by definition between two terminals which may not necessarily be coupled to any particular component. The Two Common Component filter thus captures and groups only those subsets of connections which happen to actually extend between terminals of not only two components, but the same two components.

The One Common Component filter distinguishes and sorts in much the same manner as the Two Common Component filter, except that it requires the given connections to be coupled to the terminals of but one common component. The filter preferably carries out a looped search of the connections in a candidate bundle (or updated bundle candidate) successively for each component whose terminal couples to at least one connection. This search is repeated for each component associated with at least one connection in the candidate, such that all examined connections found coupled to a terminal of such component are grouped into a corresponding bundle candidate. It is quite possible for a connection to be included in multiple bundle candidates—where it extends between terminals of two different components, and each component is one to which one or more other examined connections is also coupled.

That a connection may be included in more than one bundle candidate by this filtering is not necessarily problematic. Indeed, it is quite desirable in those applications where, for instance, certain connections may be so disposed that different intermediate portions thereof may optimally require adaptive grouping with different combinations of other connections, so as to form different bundles having different gather points.

The Proximity filter examines each connection of a candidate bundle (or subsequently updated bundle candidate) for its nearness (within a pre-specified proximity limit) to a reference connection selected as such from the candidate. The filter may use more than one reference connection to distinguish and segregate those connections disposed within the specified proximity of each reference connection into a separate bundle candidate for further processing.

In the example of the Pin Proximity filter employed in the disclosed embodiment, the filter operates as follows. It selects any connection from the candidate as the reference connection. It then groups with this reference connection each of the other connections from the given candidate whose source and target 'pins' are both within the number of pin proximity units set by the user (100 in the example of FIG. 14B) relative to the reference connection's corresponding pins. The filter carries this grouping process out recursively until no additional connections may be grouped with the reference connection. If ungrouped connections remain in the candidate, another reference connection is selected from them, and the process repeated for the other ungrouped connections relative to the newly-selected reference connection. This continues until the candidate's connections have been exhausted, or until no further grouping is possible. The connections grouped with each reference connection then form an updated bundle candidate for further processing.

These and other filters may be employed in accordance with the present invention in any suitable combination, and in any suitable order to optimally adapt the bundling of connections. The filtering is preferably applied beginning with the most restrictive filter (which segregates each candidate into the most residual candidates) on to the least restrictive, but may be applied in any other suitable manner to minimize the expected processing load. Varying the order in which a given set of filters are successively applied to an updatable master list of bundle candidates should not affect the make up of bundle candidates ultimately obtained—that is, unless the filtering discriminants are not independently applicable, and the prior application of one measurably affects the nature/applicability of the other.

The Proximity filter, such as the Pin Proximity filter of FIG. 14B, is shown applied last, at block 1460, in the disclosed embodiment because it tends to be among the most processing intensive of filters, and therefore among the most time consuming. It is preferable for that reason to apply the other user selected filters first, and thereby minimize the size of bundle candidates before this filter is applied.

Although not separately shown in FIG. 14A, discrimination filtering at the connection level is preferably accompanied in the illustrated embodiment by a bundle level check of the resulting bundle candidates against one or more preselected bundling criteria. In the example of FIG. 14B, a quantitative measure indicative of threshold bundle size is set in the form of a user-specified Minimum Rat Count setting 1416. While various other suitable criteria may be employed in alternative embodiments, this setting requires a bundle candidate, for example, to include at least the user-specified number of connections, or Rats, to qualify for bundling.

Only the bundle candidates clearing this check against the specified bundling criteria are then made available for actual bundling. Bundles are created for each such remaining bundle candidate(s) at block 1460 in suitable manner, such as described in following paragraphs, and the bundle filtering process is exited at block 1470.

What preferably results is a set of autobundled connections tailored in highly adaptive manner to optimize the given layout's routing. The user-selectable combinations of variously discriminating filters make available numerous autobundling options which a user may conveniently 'try' before adopting to best suit the needs of the intended application.

As described in preceding paragraphs, a Flow includes one or more Flow Lines and zero or more Flow Vias. In certain embodiments of the invention, each Flow Line is displayed as a Fat Rat having a width proportional to the sum of the widths of the Rats in its Bundle. However, other representations are possible, such as the extent of actual paths of all of the Rats when the Rats have associated route information or plan information.

Each Rat can be visually represented with two Rake Lines, one at each end of the Flow as illustrated by 210a and 210d of FIG. 2. Whether the Rake Lines are displayed or not displayed is, in certain embodiments of the invention, a user selectable option.

Any of several possible user interface mechanisms may be used by the designer to interactively create and modify Flows, such as through adding new vertices to a Flow, moving existing vertices within a Flow, or to remove vertices from the Flow. Alternatively, an interactive mechanism could be provided to select a series of locations using a mouse or other pointing device to specify a series of locations for vertices of a Flow. Similar interactive mechanisms could be provided to add a Flow Via to a Flow, to move an existing Flow Via within a Flow or to delete an existing Flow Via from a Flow.

Without the ability of controlling autorouting with Flows by the present invention, the Flow and Bundle information is merely a graphical tool, albeit a useful one. Certain embodiments of the invention, however, allow Bundles to control autorouting even without Flows, such as by automatically applying any properties or attributes associated with a Bundle to each Rat in its Bundle. For example, if the Bundle has a certain required layer assignment, then the Rat is to be routed on that layer. This can be implemented in the form of a strict rule, for example, that the Rat can only be routed on the specified layer. Such a rule may be implemented with an exception for preexisting routes, for example, by a rule that specifies that new segments may only be created on the specified layer, but preexisting segments may be on any layer.

Exceptions may also be provided for surface mount devices, where the Terminal is only defined on an outer layer. The exceptions may allow short segments to be created on the Terminals layer so as to only reach a via to the specified layer. The layer specification may also be a preference, as opposed to a rule. For example, the Rat may be routed on any layer, but all other layers may incur some specific additional "cost".

Bundles without a defined Flow are displayed, in certain embodiments, as a Flow with one Flow Segment. In certain embodiments, such Flows are for display purposes only and do not affect routing. However, the Bundle properties, as described above, will still be applied by the routing engine.

Figure 15:
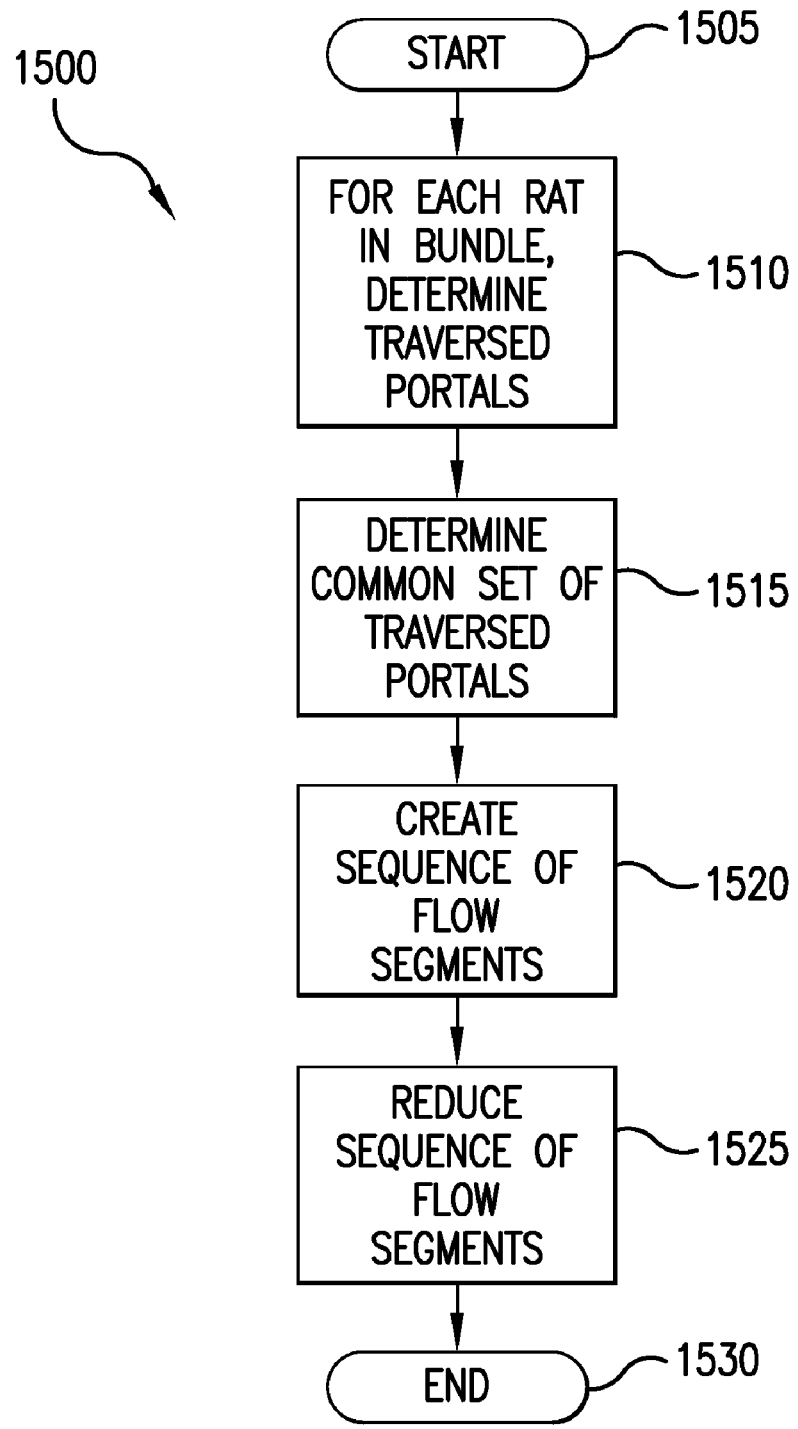
FIG. 15 is a process flow diagram illustrating exemplary method steps toward creating flow paths from interconnections bundles in accordance with certain embodiments of the present invention.
Figure 16A:
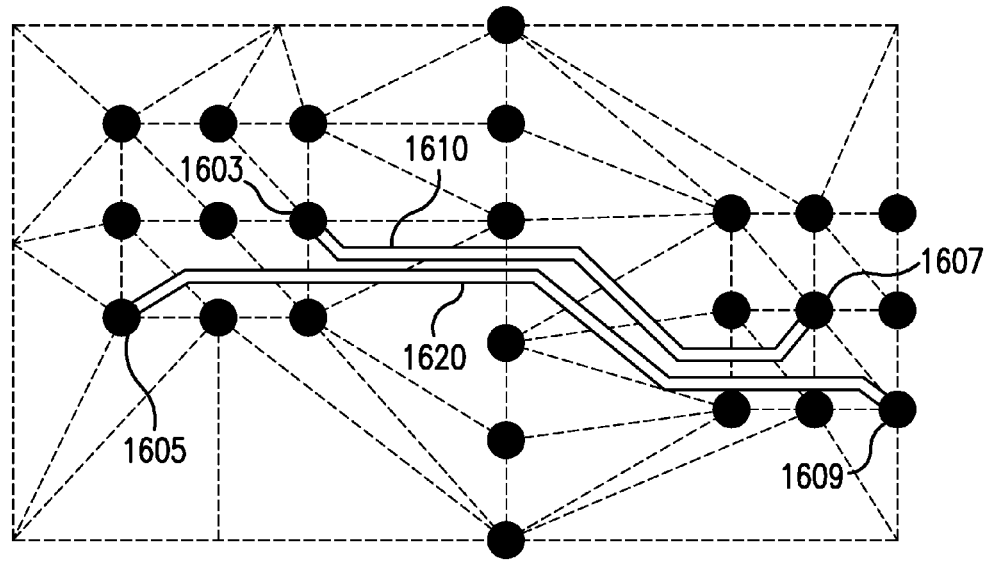
FIGS. 16A-16F are diagrams of a printed circuit layout for illustrating path creation from routed interconnections in accordance with embodiments of the present invention.
Figure 16B:
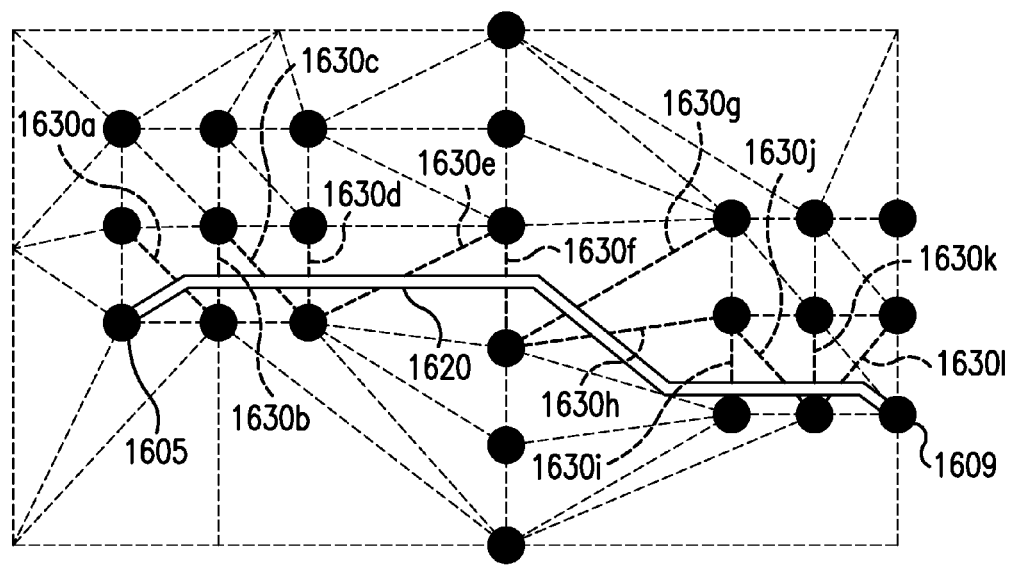
Figure 16C:
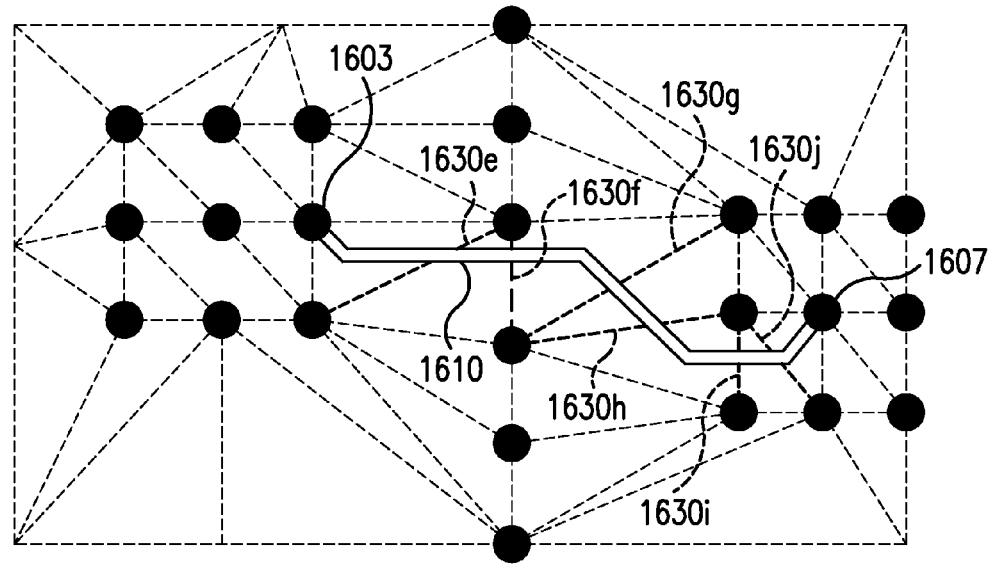
Figure 16D:
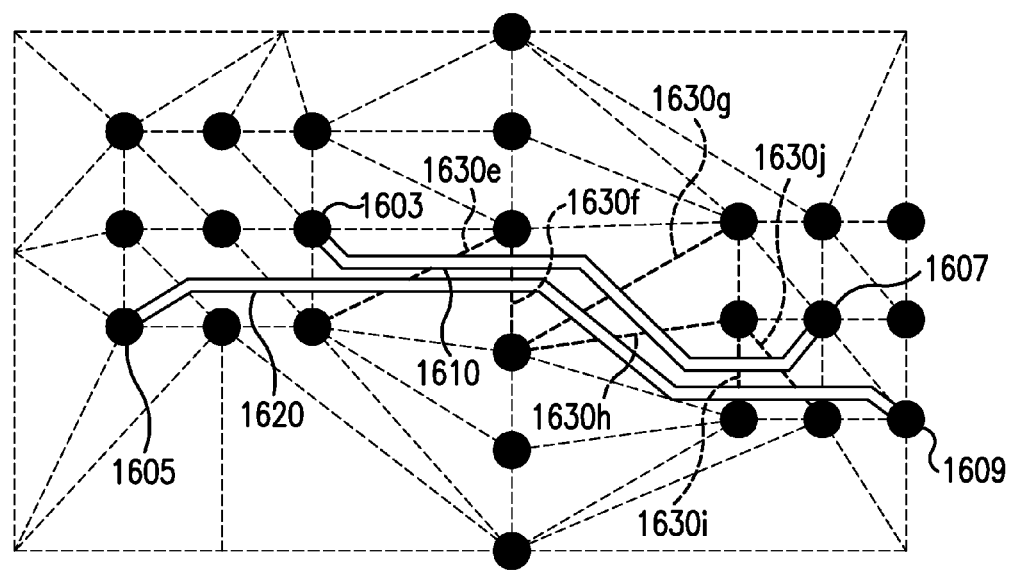
Figure 16E:
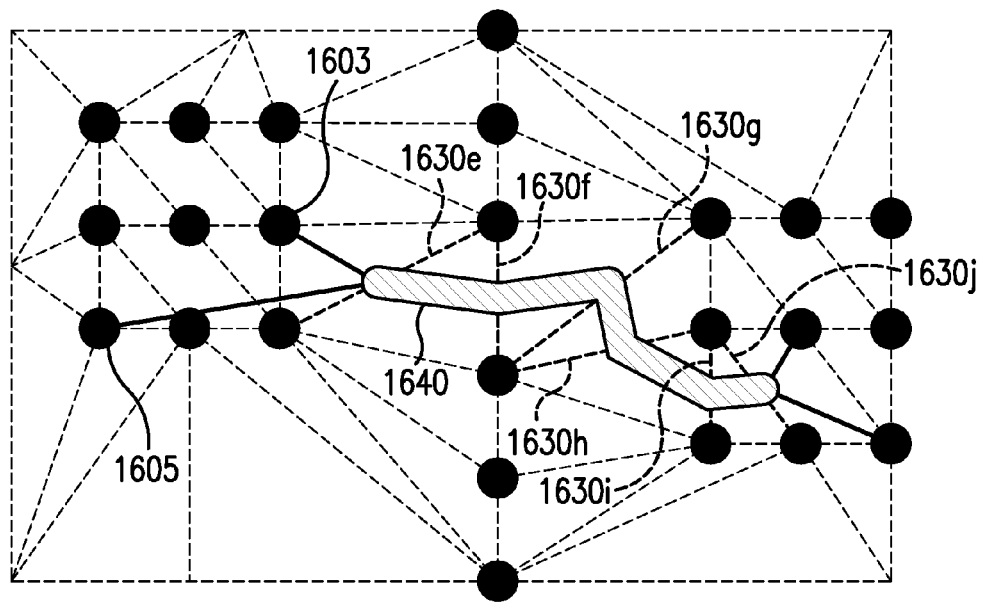

Referring now to FIG. 15, there is shown the exemplary method steps for automatically creating a Flow for a given Bundle if any of its Rats have been routed. Such routed Rats are depicted in FIG. 16A, where Rat 1610 is shown being routed along a path between Terminals 1603 and 1607, and Rat 1620 being routed along a path between Terminals 1605 and 1609. The procedure 1500 is entered at block 1505 and proceeds to block 1510, where the path of each Rat in a Bundle is analyzed to determine which Portals have been traversed thereby. An ordered list of Preferred Portals is created for each of the Rats. In FIG. 16B, the Preferred Portals for Rat 1620 are 1630a-1630l. For Rat 1610, as illustrated in FIG. 16C, the Preferred Portals are 1630e-1630j. The procedure 1500 then proceeds to block 1515, where the common subset of the Portals is found. As is shown in FIG. 16D, the common sequence of Portals traversed by two routed Rats is 1630e-1630j. Flow of process 1500 is then transferred to block 1520, whereby a sequence of Flow Segments is created from the center of each common Portal to the center of the next common Portal. FIG. 16E depicts a sequence of Flow Segments generated from the sequence of common Portals. The process 1500 then continues at block 1525, where the sequence of Flow Segments is reduced. There are several possible methods for performing this reduction. One procedure would attempt removing one of the vertices of the Flow and combining two adjacent Flow Segments into one. If the resulting sequence of Flow Segments still traverses the same common Portal, then that change is accepted. Otherwise, the two Flow Segments are reinserted and a different reduction is attempted. Another possible reduction would be to compute for each Rat the sum of the length both of its rake ends and the common Flow and then to find an optimal location for the two Gather Points using a suitable linear programming routine to minimize total length of the Flow.

Figure 16F:
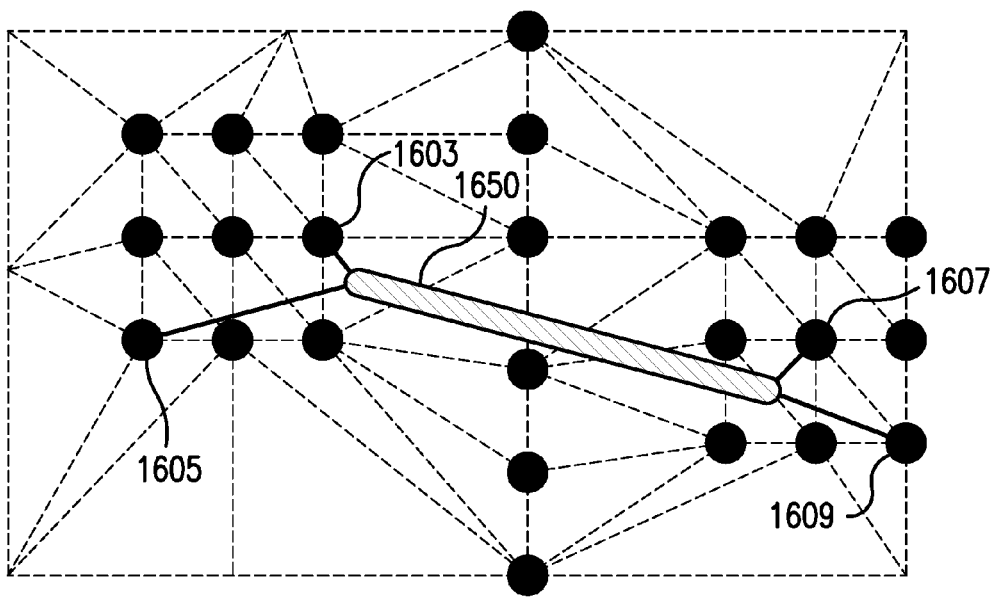

The process 1500 of FIG. 15 is exited at block 1530. FIG. 16F shows an exemplary Flow after a series of reductions has occurred. It should be noted that the process 1500 may be used on Rats that have been planned in a topological routing environment prior to the Rats being geometrically routed.

The descriptions above are intended to illustrate possible implementations of the present invention and are not restrictive. Many variations, modifications and alternatives will become apparent to the skilled artisan upon review of this disclosure. For example, components equivalent to those shown and described may be substituted therefor, elements and method steps individually described may be combined, and elements described as discrete may be distributed across many components. The scope of the invention should therefore be determined not with reference to the description above, but with reference to the appended Claims, along with their full range of equivalents.

What is claimed is:

1. A method for selectively configuring a circuit design having a plurality of component terminals for physical implementation comprising:

(a) establishing and user-updating in a processor a plurality of components for a layout of the circuit design, and defining for said layout a plurality of connections to be autorouted and bundled between predetermined terminals of the components;

(b) selectively grouping in interactively modifiable manner a plurality of said connections into at least one candidate bundle;

(c) applying at least one filter to said connections of each said candidate bundle for responsive segregation according to an interactively selected connection discriminant into one or more updated bundle candidates; said filter segregating responsive to said preselected connection discriminant to refine each said candidate bundle according to at least one connection-distinguishing factor applicable to selected intermediate portions of said connections prior to autorouting; and, (d) generating bundles corresponding to said updated bundle candidates prior to autorouting for interactively guiding execution of the autorouting;

wherein said user-updating is responsive to said connection-distinguishing factor.

2. The method as recited in claim 1 further comprising evaluating each said updated bundle candidate in accordance with at least one preselected bundling criteria for removal of any said updated candidate grouping failing to satisfy said preselected bundling criteria.

3. The method as recited in claim 2, wherein each said updated bundle candidate is evaluated at (c) in accordance with a plurality of said bundling criteria.

4. The method as recited in claim 1, wherein each said bundle combines intermediate portions of said connections in each said updated bundle candidate for joint routing therewith.

5. The method as recited in claim 1, wherein said connections of each said candidate bundle are filtered in accordance with at least one said connection discriminant selected from the group consisting of:

i. a discriminant distinguishing said connections commonly assigned to a bus in said layout;

ii. a discriminant distinguishing said connections commonly assigned to a circuit board layer in said layout;

iii. a discriminant distinguishing said connections commonly assigned to a match group defining a shared parametric range;

iv. a discriminant distinguishing said connections sharing a common value for a user-specified property;

v. a discriminant distinguishing said connections sharing a common value for a user-specified parametric constraint;

vi. a discriminant distinguishing said connections coupled to terminals of at least one common component; and, vii. a discriminant distinguishing said connections disposed within a preset proximity one relative to the other.

6. The method as recited in claim 1, wherein said filter includes at least one connection discriminant selected from the group consisting of: a Same Bus discriminant, a Same Layer Set discriminant, a Same Match Group discriminant, a Same User Selected Property discriminant, a Same User Selected Constraint discriminant, a Two Common Components discriminant, a One Common Component discriminant, and a Proximity discriminant.

7. The method as recited in claim 1, wherein (c) is carried out iteratively for each of a plurality of said filters having a plurality of said preselected connection discriminants corresponding thereto, said filters being applied in succession at (c) to said connections of said updated bundle candidates resulting from immediately preceding application of one said filter.

8. The method as recited in claim 2, wherein said bundling criteria includes a minimum bundle size criteria requiring each said updated bundle candidate to contain at least a predetermined number of connections.

9. The method as recited in claim 1, further comprising:
programmably implementing the processes (a)-(d) in computer readable media.

10. A method for selectively configuring a circuit design having a plurality of component terminals for physical implementation comprising:

(a) establishing and user-updating a plurality of components for a layout of the circuit design, and defining in a processor for said layout a plurality of connections to be autorouted between predetermined terminals of the components;

(b) establishing a plurality of filters for sorting said connections according to at least one interactive preselected connection discriminant;

(c) selectively grouping in interactively modifiable manner a plurality of said connections into at least one candidate grouping; said filters responsive to said preselected connection discriminant and for refining each said candidate grouping according to at least one connection-distinguishing factor applicable to selected intermediate portions of said connections;

(d) iteratively applying a user-selected combination of said filters to said connections of each said candidate grouping for responsive segregation in a processor into one or more updated candidate groupings prior to autorouting, successive ones of said filters being applied to said candidate groupings as updated by said filter immediately preceding; and, (e) generating bundles corresponding to said updated candidate groupings resulting from said iterative application of said filter combination prior to autorouting for interactively guiding execution of the autorouting thereby.

11. The method as recited in claim 10, wherein in (d) includes evaluating each said updated candidate grouping in accordance with at least one preselected bundling criteria for removal of any said updated candidate grouping failing to satisfy said preselected bundling criteria.

12. The method as recited in claim 11, wherein said bundling criteria includes a minimum bundle size criteria requiring each said updated bundle candidate to contain at least a predetermined number of connections.

13. The method as recited in claim 11, wherein each said updated bundle candidate is evaluated at (d) in accordance with a plurality of said bundling criteria.

14. The method as recited in claim 10, further comprising:
programmably implementing the processes (a)-(e) in computer readable media.

15. The method as recited in claim 10, further comprising prior to (e) evaluating each said updated candidate grouping in accordance with at least one preselected bundling criteria for removal of any said updated candidate grouping failing to satisfy said preselected bundling criteria.

16. The method as recited in claim 10, wherein said filters applied in (d) segregate said connections in accordance with at least one said connection discriminant selected from the group consisting of:

i. a discriminant distinguishing said connections commonly assigned to a bus in said layout;

ii. a discriminant distinguishing said connections commonly assigned to a circuit board layer in said layout;

iii. a discriminant distinguishing said connections commonly assigned to a match group defining a shared parametric range;
iv. a discriminant distinguishing said connections sharing a common value for a user-specified property;
v. a discriminant distinguishing said connections sharing a common value for a user-specified parametric constraint;
vi. a discriminant distinguishing said connections coupled to terminals of at least one common component; and,
vii. a discriminant distinguishing said connections disposed within a preset proximity one relative to the other.

17. The method as recited in claim 10, wherein each said filter includes at least one connection discriminant selected from the group consisting of: a Same Bus discriminant, a Same Layer Set discriminant, a Same Match Group discriminant, a Same User Selected Property discriminant, a Same User Selected Constraint discriminant, a Two Common Components discriminant, a One Common Component discriminant, and a Pin Proximity discriminant.

18. A system for selectively configuring a circuit design having a plurality of component terminals for physical implementation comprising:
an autorouting engine;
a bundle filtering unit operably coupled to said autorouting engine, said bundle filtering unit being operable to:
receive information for components in a layout of the circuit design, and define for said layout a plurality of connections to be autorouted between predetermined terminals of the components;
selectively group a plurality of said connections in interactively modifiable manner into at least one candidate bundle;
apply at least one filter to said connections of each of said candidate bundle for responsive segregation according to an interactively selected connection discriminant into one or more updated bundle candidates; said filter segregating responsive to said preselected connection discriminant to refine each of said candidate bundle according to at least one connection-distinguishing factor applicable to selected intermediate portions of said connections prior to autorouting; and
generate bundles corresponding to said updated bundle candidates prior to autorouting for interactively guiding execution of the autorouting thereby.

19. The system as recited in claim 18, wherein said bundle filtering unit is operable to evaluate each said updated bundle candidate in accordance with at least one preselected bundling criteria for removal of any said updated candidate grouping failing to satisfy said preselected bundling criteria.

20. The system as recited in claim 18, wherein said bundle filtering unit is operable to selectively filter said connections of each said candidate bundle in accordance with at least one said connection discriminant selected from the group consisting of:
i. a discriminant distinguishing said connections commonly assigned to a bus in said layout;
ii. a discriminant distinguishing said connections commonly assigned to a circuit board layer in said layout;
iii. a discriminant distinguishing said connections commonly assigned to a match group defining a shared parametric range;
iv. a discriminant distinguishing said connections sharing a common value for a user-specified property;
v. a discriminant distinguishing said connections sharing a common value for a user-specified parametric constraint;
vi. a discriminant distinguishing said connections coupled to terminals of at least one common component; and,
vii. a discriminant distinguishing said connections disposed within a preset proximity one relative to the other.

21. The system as recited in claim 18, wherein said filter includes at least one connection discriminant selected from the group consisting of: a Same Bus discriminant, a Same Layer Set discriminant, a Same Match Group discriminant, a Same User Selected Property discriminant, a Same User Selected Constraint discriminant, a Two Common Components discriminant, a One Common Component discriminant; and, a Proximity discriminant.

22. The system as recited in claim 18, wherein said bundle filtering unit is operable to iteratively apply each of a plurality of said filters having a plurality of said preselected connection discriminants corresponding thereto, said filters being applied in succession to said connections of said updated bundle candidates resulting from immediately preceding application of one said filter.

23. The system as recited in claim 19, wherein said bundle filtering unit is operable to evaluate according to a plurality of said bundling criteria, said bundling criteria including a minimum bundle size criteria requiring each said updated bundle candidate to contain at least a predetermined number of connections.

* * * * *